(12) United States Patent
Hata

(10) Patent No.: US 7,939,929 B2
(45) Date of Patent: May 10, 2011

(54) SEMICONDUCTOR LASER DEVICE AND METHOD OF FABRICATING SEMICONDUCTOR LASER DEVICE

(75) Inventor: Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 301 days.

(21) Appl. No.: 11/529,475

(22) Filed: Sep. 29, 2006

(65) Prior Publication Data

US 2007/0075320 A1    Apr. 5, 2007

(30) Foreign Application Priority Data

Sep. 30, 2005 (JP) ................. 2005-288254

(51) Int. Cl.
*H01L 23/52* (2006.01)
(52) U.S. Cl. ............ 257/690; 257/102; 257/98; 257/94; 257/E21.121
(58) Field of Classification Search .......... 257/690, 257/102, 98, 94, E21.121; 438/463, 22, 372
See application file for complete search history.

(56) References Cited

U.S. PATENT DOCUMENTS

| | | | |
|---|---|---|---|
| 2005/0207463 A1* | 9/2005 | Nomoto et al. ............ | 372/43.01 |
| 2007/0110113 A1* | 5/2007 | Kwak et al. ................ | 372/43.01 |

FOREIGN PATENT DOCUMENTS

| | | |
|---|---|---|
| JP | 51040778 A | 4/1976 |
| JP | 2000183438 A | 6/2000 |
| JP | 2005142347 A | 6/2005 |

OTHER PUBLICATIONS

IEICE Technical Report; ISSN 0913-5685; IEICE Technical Report vol. 102 No. 119; LQE2002-71 to 90; Laser/quantum electronics; Jun. 15, 2002; p. 55-57; The Institute of Electronics, Information and Communication Engineers.
Office Action issued on Aug. 31, 2010 in the corresponding to the Japanese Patent Application No. 2005-288254.

\* cited by examiner

*Primary Examiner* — Cuong Q Nguyen
*Assistant Examiner* — Cathy N Lam
(74) *Attorney, Agent, or Firm* — NDQ&M Watchstone LLP

(57) ABSTRACT

A semiconductor laser device includes a supporting substrate; a semiconductor laser device portion which is formed on a surface of the supporting substrate, and which includes a pair of cavity surfaces; an adhesive layer with which the supporting substrate and the semiconductor laser device portion are adhered to each other; and areas, in which no adhesive layer exists, the areas being near the ends respectively of the cavity surfaces, the ends being closer to the supporting substrate.

15 Claims, 29 Drawing Sheets

CLEAVAGE

CLEAVAGE

SEMICONDUCTOR LASER DEVICE AND METHOD OF FABRICATING SEMICONDUCTOR LASER DEVICE

CROSS REFERENCE TO RELATED APPLICATION

This application is based upon and claims the benefit of priority from prior Japanese Patent Application P2005-288254 filed on Sep. 30, 2005; the entire contents of which are incorporated by reference herein.

BACKGROUND OF THE INVENTION

1. Field of the Invention

The present invention relates to a semiconductor laser device and a method of fabricating the same, and particularly relates to a semiconductor laser device formed by adhering a semiconductor laser device portion and a supporting substrate, and to a method of fabricating the semiconductor laser device.

2. Description of the Related Art

Conventionally, a semiconductor laser device formed by the following procedure and a method of fabricating the same are known. Specifically, the semiconductor laser device is formed by adhering a semiconductor laser device portion and a supporting substrate, and by then splitting the substrate, on which the semiconductor laser device portion is formed (for instance, refer to Technical Report of IEICE, Vol. 102, LQE2002-85, pp. 55-57, which is referred to as Document 1 below).

Document 1 describes a semiconductor laser device fabricated by laser lift-off (LLO) and a method of fabricating the semiconductor laser device.

FIG. 1 is a cross sectional view illustrating a conventional semiconductor laser device disclosed in Document 1. Referring to FIG. 1, in the conventional semiconductor device, a contact metal layer 302 is formed on a GaAs substrate 301 serving as a supporting substrate. The contact metal layer 302 consists of Ti and Au layers in order from the lower tier to the upper tier. A first fusion layer 303 of Sn is formed on the contact metal layer 302. A second fusion layer 304 of Au is formed on the first fusion layer 303. A semiconductor device layer 306 including a ridge 305, which projects downward, is formed on the second fusion layer 304. A GaN layer 307 is formed on the semiconductor device layer 306. Note that the GaAs substrate 301 and the GaN layer 307 are formed in a way that the cleavage planes of the GaAs substrate 301 and the GaN layer 307 respectively meet each other. An electrode 308, which consists of a Ti, Al, Ti and Au layers, is formed on the GaN layer 307. An electrode 309, which consists of a Ti layer and an Au layer, is formed on the back surface of the GaAs substrate 301.

FIGS. 2 to 4 are cross-sectional views of the conventional semiconductor laser device disclosed in Document 1, each for explaining a method (LLO) of fabricating the device. Referring to FIGS. 1 to 4, the method of fabricating the conventional semiconductor laser device is as follows. First, as illustrated in FIG. 2, the GaN layer 307 is grown on the (0001) plane of a sapphire substrate 310 serving as a growth substrate by use of metal organic chemical deposition (MOCVD). Subsequently, the semiconductor device layer 306, which includes the ridge 305, is grown on the GaN layer 307. Thereafter, the second fusion layer 304 of Au is formed on the semiconductor device layer 306.

Subsequently, as illustrated in FIG. 3, the contact metal layer 302, which consists of the Ti and Au layers, is formed on the GaAs substrate 301. On the contact metal layer 302, the first fusion layer 303 of Sn is formed. Then, the first and second fusion layers 303 and 304 are adhered to each other. In this event, the first and second fusion layers 303 and 304 are adhered to each other so that the cleavage planes of the respective GaAs substrate 301 and the GaN layer 307 meet each other. Thereafter, the semiconductor laser device obtained by the adhesion is held for approximately 10 minutes at approximately 310° C. in a nitrogen atmosphere. Thus, Sn of the first fusion layer 303 and Au of the second fusion layer 304 are alloyed, and hence the GaAs substrate 301 and the GaN layer 307 on the sapphire substrate 310 are attached together as, as shown in FIG. 4.

Thereafter, the sapphire substrate 310 is irradiated with the fourth harmonic Nd-YAG laser having a wavelength of 266 mn. By heat generated through the irradiation, GaN in the interface between the sapphire substrate 310 and the GaN layer 307 is melted and decomposed into Ga metal and N. Thus, the sapphire substrate 310 is removed from the GaN layer 307. Incidentally, Ga metal, which is attached to the surface of the GaN layer 307 after the removal of the sapphire substrate 310, is cleaned off with HCl, and is then removed. Thereafter, as illustrated in FIG. 1, the electrode 308 is formed on the GaN layer 307, and the electrode 309 is formed on the back surface of the GaAs substrate 301. The electrode 308 consists of the Ti, Al, Ti and Au layers in order from the lowermost tier to the uppermost tier. The electrode 309 consists of the Ti and Au layers in order from the lower tier to the upper tier.

Finally, the semiconductor laser device is split by cleaving the semiconductor laser device along the cleavage plane of the GaN layer 307. Thereby, the cavity surfaces of the semiconductor laser device are formed. In this manner, the conventional semiconductor laser device disclosed in Document 1 is fabricated. The fabricating method makes it possible to remove the sapphire substrate 310, which serves as a growth substrate, and which has poor cleavability. Accordingly, the cleavability of the nitride semiconductor laser device can be improved. In a case where a GaN substrate is used as a growth substrate instead of the sapphire substrate 310, the GaN substrate is separated and repeatedly used. Because the GaN substrate is expensive, the separation and repeated use makes it possible to reduce costs. For this reason, it is useful that the technique of adhering a semiconductor device portion and a supporting substrate to each other is applied to the method of fabricating a semiconductor laser device portion.

However, the conventional semiconductor laser device disclosed in Document 1 has the following problems. First, the semiconductor device layer 306 is adhered to the GaAs substrate 301 with the second fusion layer 304 of Au having no cleavability. Although the GaAs substrate 301 has cleavability, the flatness of the cleavage plane of the semiconductor laser device is deteriorated due to the existence of the second fusion layer 304 which is made of Au having no cleavability, and which is formed between the GaAs substrate 301 and the GaN layer 307. Second, in a case where, instead of the GaAs substrate 301 having cleavability, metal having no cleavability, such as Cu—W, is used as a supporting substrate, the problem is that the flatness of cleavage plane of the semiconductor laser device is further deteriorated.

SUMMARY OF THE INVENTION

A first aspect of the present invention is to provide a semiconductor laser device including: (a) a supporting substrate; (b) a semiconductor laser device portion which is formed on a surface of the supporting substrate, and which includes a pair of cavity surfaces; (c) an adhesive layer with which the supporting substrate and the semiconductor laser device portion are adhered to each other; and (d) areas, in which no the adhesive layer exists, the areas being near the ends respectively of the cavity surfaces, and the ends being closer to the supporting substrate.

A second aspect of the present invention is to provide a method of fabricating a semiconductor laser device comprising: (a) adhering a semiconductor laser device portion to a surface of a supporting substrate with an adhesive layer interposed in between, and forming first areas, in which no adhesive layer exists, near the ends of areas, which serves as cavity surfaces, of the semiconductor laser device portion, the ends being closer to the supporting substrate, and (b) forming a pair of the cavity surfaces respectively near the first areas.

BRIEF DESCRIPTIONS OF THE DRAWINGS

DETAILED DESCRIPTIONS OF THE PREFERRED EMBODIMENTS

Based on the drawings, descriptions will be provided below for embodiments of the present invention.

First Embodiment

Figure 1:
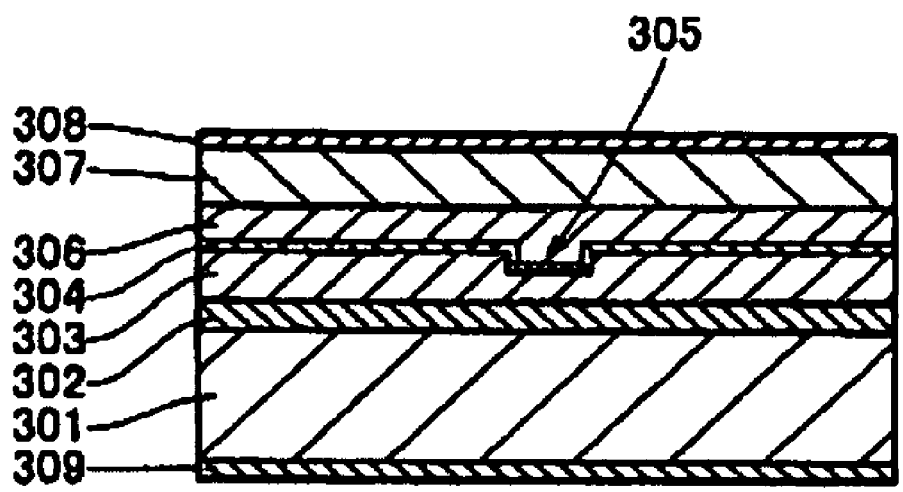
FIG. 1 is a cross-sectional view of a conventional semiconductor laser device disclosed in Document 1.
Figure 2:
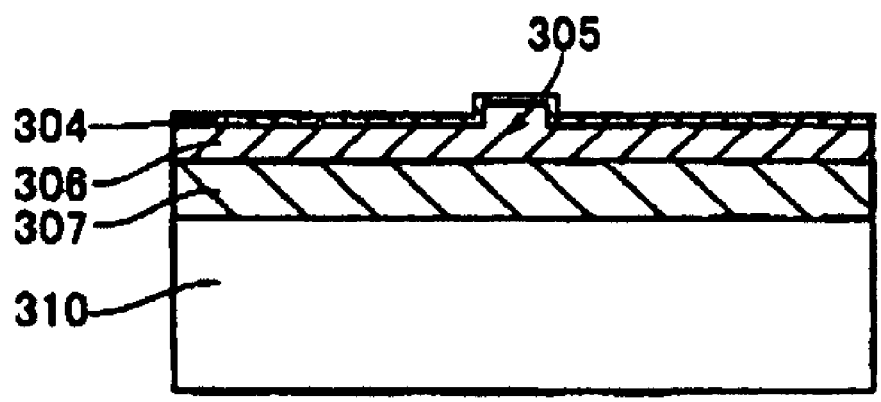
FIG. 2 is a cross-sectional view of the conventional semiconductor laser device disclosed in Document 1, for explaining a method (LLO) of fabricating the semiconductor laser device.
Figure 3:
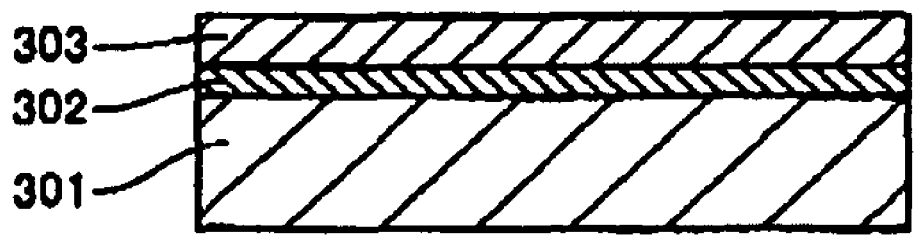
FIG. 3 is a cross-sectional view of the conventional semiconductor laser device disclosed in Document 1, for explaining the method (LLO) of fabricating the semiconductor laser device.
Figure 4:
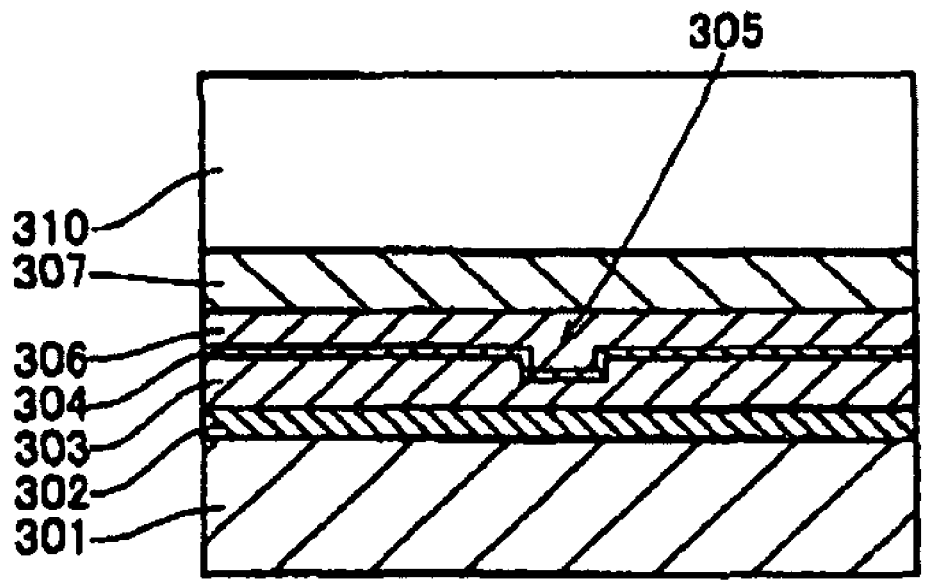
FIG. 4 is a cross-sectional view of the conventional semiconductor laser device disclosed in Document 1, for explaining the method (LLO) of fabricating the semiconductor laser device.
Figure 5:
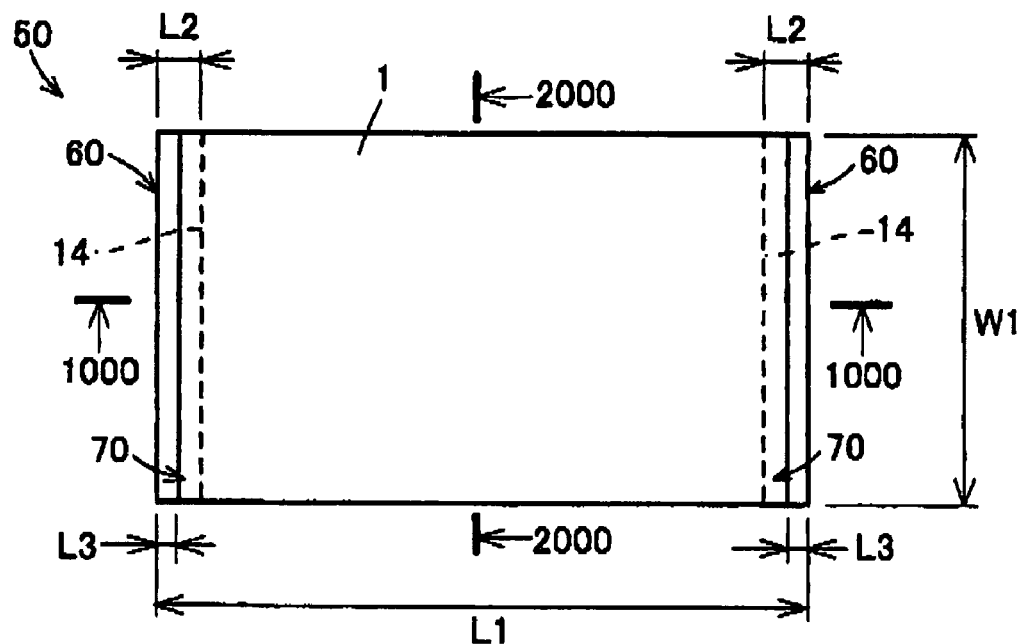
FIG. 5 is a plan view illustrating a semiconductor laser device of a first embodiment of the present invention.
Figure 6:
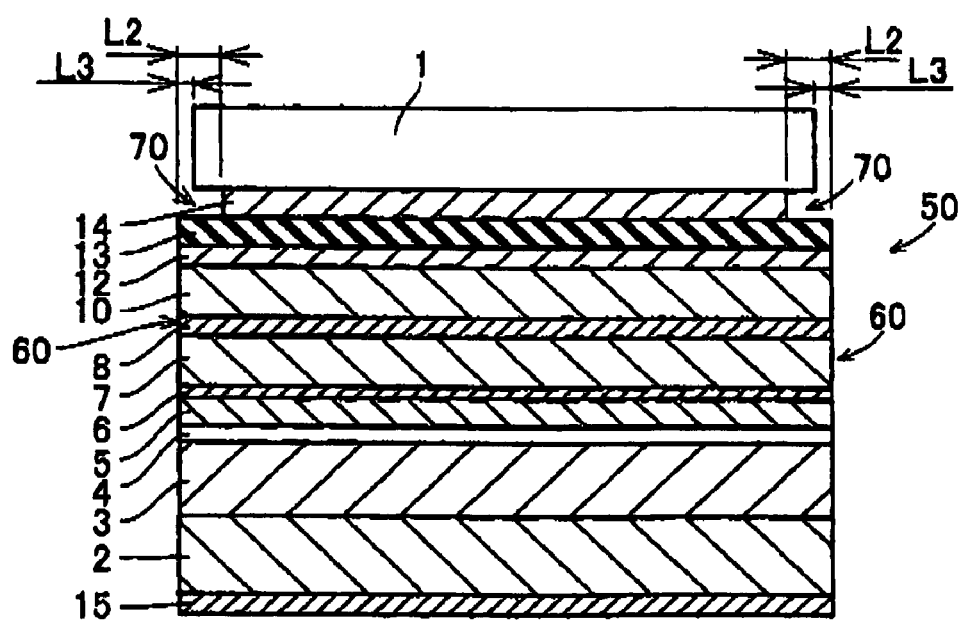
FIG. 6 is a cross sectional view of the semiconductor laser device of the first embodiment illustrated in FIG. 5, taken along the line 1000-1000.
Figure 7:
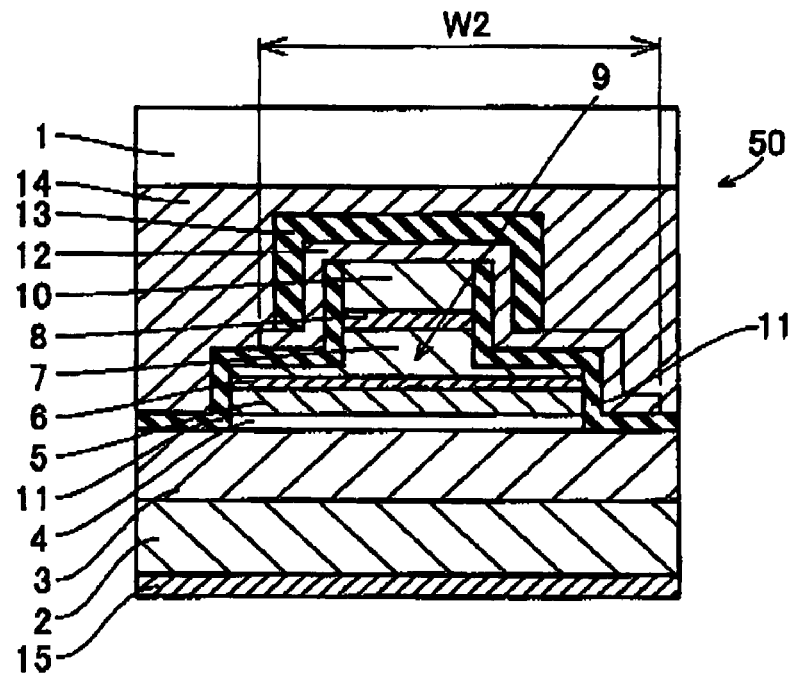
FIG. 7 is a cross-sectional view of the semiconductor laser device of the first embodiment illustrated in FIG. 5, taken along the line 2000-2000.
Figure 8:
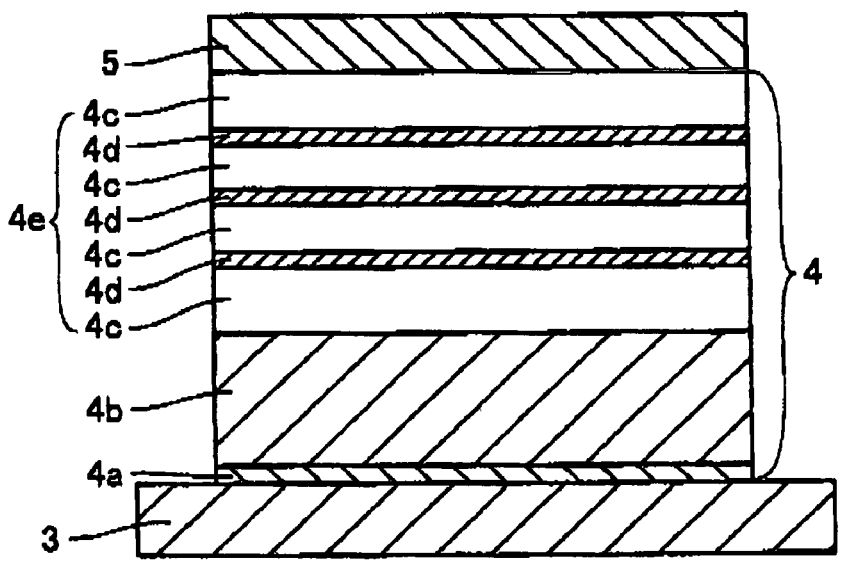
FIG. 8 is a cross-sectional view of the structure of a light emitting layer of the semiconductor laser device of the first embodiment illustrated in FIG. 5.

FIG. 5 is a plan view illustrating a semiconductor laser device of a first embodiment of the present invention. FIG. 6 is a cross-sectional view of the semiconductor laser device of the first embodiment illustrated in FIG. 5, taken along the line 1000-1000. FIG. 7 is a cross-sectional view of the semiconductor laser device of the first embodiment illustrated in FIG. 5, taken along the line 2000-2000. FIG. 8 is a cross-sectional view of the structure of a light emitting layer of the semiconductor laser device of the first embodiment illustrated in FIG. 5. First, by referring to FIGS. 5 to 8, descriptions will be provided for the structure of the semiconductor laser device of the first embodiment.

In the semiconductor laser device of the first embodiment, an electric conductive supporting substrate 1, which is made of Cu—W having no cleavability, and a semiconductor laser device portion 60 are adhered to each other with an electric conductive solder layer 14 of AuSn interposed in between, as illustrated in FIG. 5. Incidentally, the solder layer 14 is an example of an "adhesive layer" of the present invention. As illustrated in FIGS. 5 and 6, a pair of cavity surfaces 60, which cleavage planes thereof constitute, are formed in the semiconductor laser device portion 50. As illustrated in FIG. 5, the length (cavity length) L1 of the semiconductor laser device is approximately 600 μm and the width W1 is approximately 400 μm.

In the first embodiment, as illustrated in FIG. 6, gaps 70 are formed respectively near the ends of the cavity surfaces 60, the ends being closer to the supporting substrate 1. Each of the gaps 70 is an area where no solder layer 14 exists. As illustrated in FIG. 5, each of the gaps 70, which is an area where no solder layer 14 exists, occupies the space extending for approximately 25 μm (L2) inward from the line along which the cavity surfaces 60 extend. In addition, since the supporting substrate 1 is diced to split the semiconductor laser device as described later, each of the side surfaces of the supporting substrate 1 is formed in a position apart inwardly from the line, along which the cavity surfaces 60 extend, by approximately 20 μm (L2).

In addition, an n-type cladding layer 3 is formed on an n-type contact layer 2 as illustrated in FIGS. 6 and 7. The n-type cladding layer 3 has a thickness of approximately 400 nm, and is made of $Al_{0.07}Ga_{0.98}N$ which is doped with approximately $5 \times 10^{18}$ Si atoms/cm$^3$, and which has a carrier concentration of approximately $5 \times 10^{18}$ cm$^{-3}$. The n-type contact layer 2 has a thickness of approximately 5 μm, and is made of GaN which is doped with approximately $5 \times 10^{18}$ Si atoms/m$^3$, and which has a carrier concentration of approximately $5 \times 10^{18}$ cm$^{-3}$. On the cladding layer 3, the light emitting layer 4 having a width of 4.5 μm, which is narrower than that of the supporting substrate 1, is formed.

As illustrated in FIG. 8, the light emitting layer 4 includes an n-type carrier blocking layer 4a formed on the n-type cladding layer 3. The n-type carrier blocking layer 4a has a thickness of approximately 5 nm, and is made of $Al_{0.18}Ga_{0.84}$nN which is doped with approximately $5 \times 10^{18}$ Si atoms/cm$^3$, and which has a carrier concentration of approximately $5 \times 10^{18}$ cm$^{-3}$. An n-type light guiding layer 4b is formed on the n-type carrier blocking layer 4a. The n-type light guiding layer 4b has a thickness of approximately 100 nm, and is made of GaN doped with Si. A multiple-quantum-well (MQW) active layer 4e, which consists of four barrier layers 4c and three quantum-well layers 4d, is formed on the n-type light guiding layer 4b. Each of the barrier layers 4c has a thickness of 20 nm, and is made of undoped In0.02Ga0.98N. Each of the quantum-well layers 4d has a thickness of approximately 3 nm, and is made of undoped In0.15Ga0.85N. The barrier layers 4c and the quantum-well layers 4d are alternately superposed. The light emitting layer 4 consists of the n-type carrier blocking layer 4a, the n-type light guiding layer 4b and the MQW active layer 4e.

On the barrier layer 4c of the light emitting layer 4, a p-type light guiding layer 5 is formed as illustrated in FIGS. 7 and 8. The p-type light guiding layer 5 has a thickness of approximately 100 nm, and is made of GaN doped with approximately $4 \times 10^{19}$ Mg atoms/cm$^3$. A p-type cap layer 6 is formed on the p-type light guiding layer 5. The p-type cap layer 6 has a thickness of approximately 20 nm, and is made of $Al_{0.16}Ga_{0.84}N$ doped with approximately $4—10^{19}$ Mg atoms/cm$^3$. On the p-type cap layer 6, a p-type cladding layer 7, which has a projection portion, is formed. The p-type cladding layer 7 is made of $Al_{0.07}Ga_{0.93}N$ which is doped with approximately $4 \times 10^{19}$ Mg atoms/cm$^3$, and which has a carrier concentration of approximately $5 \times 10^{17}$ cm$^{-3}$. The projection portion of the p-type cladding layer 7 has a thickness of approximately 400 nm, and the flat portion, other than the projection portion, of the p-type cladding layer 7 has a thickness of approximately 80 nm. On the upper surface of the projection portion of the p-type cladding layer 7, a p-type contact layer 8 is formed. The p-type contact layer 8 has a thickness of approximately 10 nm, and is made of In0.02Ga0.98N which is doped with approximately $4 \times 10^{19}$ Mg atoms/cm$^3$, and which has a carrier concentration of approximately $5 \times 10^{17}$ cm$^{-3}$. The p-type contact layer 8 and the projection portion of the cladding layer 7 constitute a ridge 9 serving as a current path. The ridge 9 has a width of approximately 1.5 μm and a height of approximately 380 nm. On the p-type contact layer 8, a p-type ohmic electrode 10, which consists of Pt, Pd and Au layers, is formed. The Pt, Pd and Au layers respectively have thicknesses of approximately 5 nm, approximately 100 nm and approximately 150 nm, and are formed in order from the lower tier to the upper tier.

As illustrated in FIG. 7, an insulating film 11 which has a thickness of approximately 250 nm, and which is made of SiN, is formed on the upper surface of the n-type cladding layer 3 and the side surfaces of the light emitting layer 4, the p-type light guiding layer 5, the p-type cap layer 6, the ridge 9 and the p-type ohmic electrode 10. On the upper surfaces of the insulating layer 11 and the p-type ohmic electrode 10, a p-type pad electrode 12, which has a width W2 of approximately 125 μm, is formed. The pad electrode 12 consists of Ti, Pd and Au layers, which respectively have thicknesses of approximately 100 nm, approximately 100 nm and approximately 3000 nm, and which are formed in order from the lower tier to the upper tier. On the p-type pad electrode 12, an insulating film 13 which has a thickness of approximately 100 nm, and which is made of $SiO_2$, is formed. The insulating film 13 has a function of inhibiting the solder layer 14 and the p-type ohmic electrode 10 from reacting with each other. The semiconductor device portion 50 has the configuration as described above, and the semiconductor device portion 50 and the supporting substrate 1 are caused to adhere with each other with the solder layer 14 interposed in between.

As illustrated in FIG. 7, an n-type electrode 15 is formed on the back surface of the n-type contact layer 2. The n-type electrode 15 consists of an n-type ohmic electrode, an n-type barrier metal and an n-type pad metal which are formed in order from the lower tier to the upper tier. Al is used for the n-type ohmic electrode constituting a part of the n-type ohmic electrode 16, and Pt, Ti or the like is used as the n-type barrier metal. The n-type barrier metal has a function of inhibiting the n-type ohmic electrode and the n-type pad electrode from reacting with each other.

As described above, the following is realized in the first embodiment. The semiconductor laser device portion 50 is formed on the surface of the supporting substrate 1, and is configured to have gaps 70 near the ends of the pair of cavity surfaces 60 included in the semiconductor laser device portion 50, the ends being closer to the supporting substrate 1. Each of the gaps 70 is an area in which no solder layer 14 exists, the solder layer used for adhering the supporting substrate 1 and the semiconductor laser device portion 60 to each other. With the gaps 70 in which no solder layer 14 exists, areas, with which the supporting substrate 1 and the semiconductor laser device portion 50 are separated from each other, can be formed respectively near the ends of the pair of cavity surfaces 60 of the semiconductor laser device portion 50, the ends being closer to the supporting substrate 1. Thus, the semiconductor laser device 50 can be cleaved with no influence from the cleavability of the supporting substrate 1 unlike the case where the solder layer 14 and the supporting substrate 1 are provided to be adjacent to the ends of the cavity surfaces 60, the ends being closer to the supporting substrate 1. Consequently, it is made possible to improve the flatness of the cleavage plane of the semiconductor laser device portion 50 even when a supporting substrate 1 of Cu—W, which has no cleavability, is used. Also, since the semiconductor laser device portion does not easily yield to influence resulting from the fact that the supporting substrate has no cleavability, the semiconductor laser device portion can be cleaved easily.

In the first embodiment, since the supporting substrate 1 and the solder layer 14 are configured to be electric conductive, the electric conductive supporting substrate 1 and the semiconductor laser device 50 can be adhered to each other with the electric conductive solder layer 14 interposed in between. Accordingly, the semiconductor device portion 50 and the supporting substrate 1 can be electrically connected to each other.

In the first embodiment, since the solder layer 14 is formed with spaces (L2) each extending inward for approximately 25 μm from the line along which the cavity surface 60 exists, the gaps 70, each of which is the area where no solder layer exists, can be easily formed respectively near the ends of the cavity surfaces 60, the ends being closer to the supporting substrate 1.

In the first embodiment, the semiconductor laser device portion 50 is preferably formed of nitride semiconductor layers. A nitride semiconductor laser device including a semiconductor laser device portion consisting of such nitride semiconductor laser layers makes it possible to improve flatness of a cleavage plane of the nitride semiconductor laser device.

Figure 9:
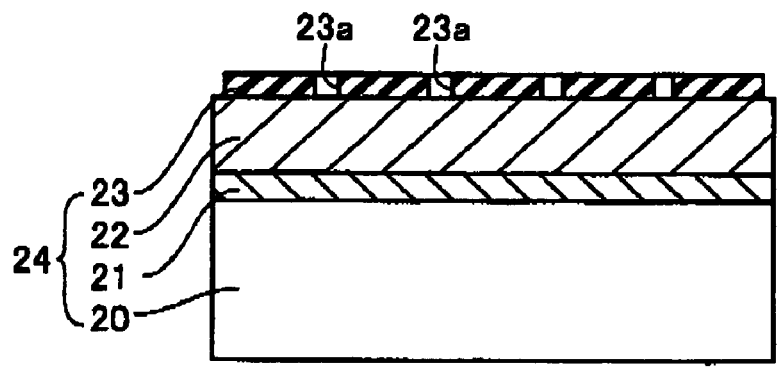
FIG. 9 is a cross-sectional view of the semiconductor laser device of the first embodiment illustrated in FIG. 5, taken along the line 2000-2000, for explaining a process of fabricating the semiconductor laser device.
Figure 10:
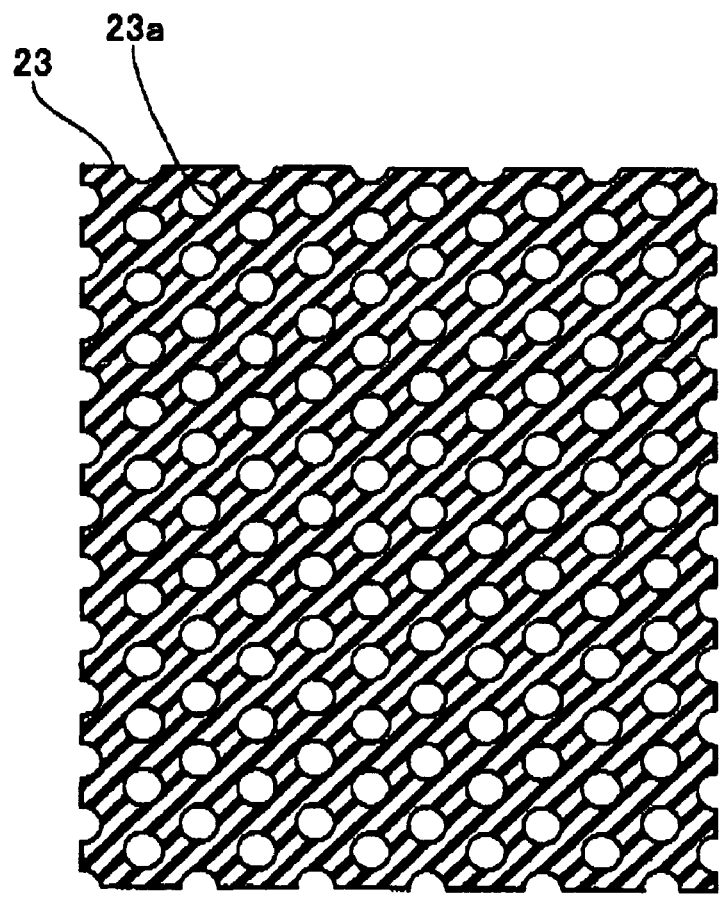
FIG. 10 is a plan view of a triangular lattice pattern of the semiconductor laser device of the first embodiment illustrated in FIG. 5, for explaining the triangular lattice pattern.
Figure 16:
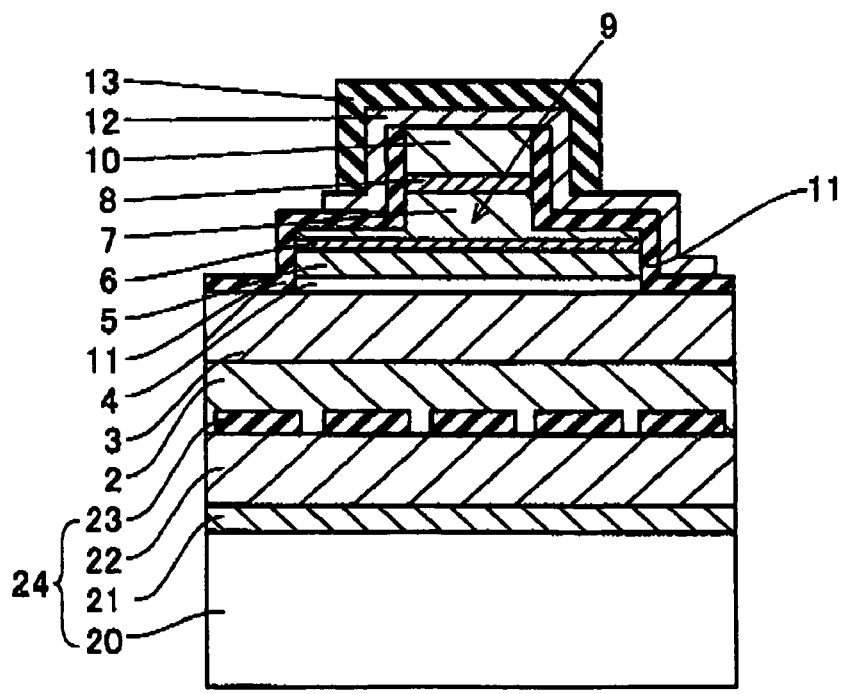
FIG. 16 is a cross-sectional view of the semiconductor laser device of the first embodiment illustrated in FIG. 5, taken along the line 2000-2000, for explaining the process of fabricating the semiconductor laser device.
Figure 17:
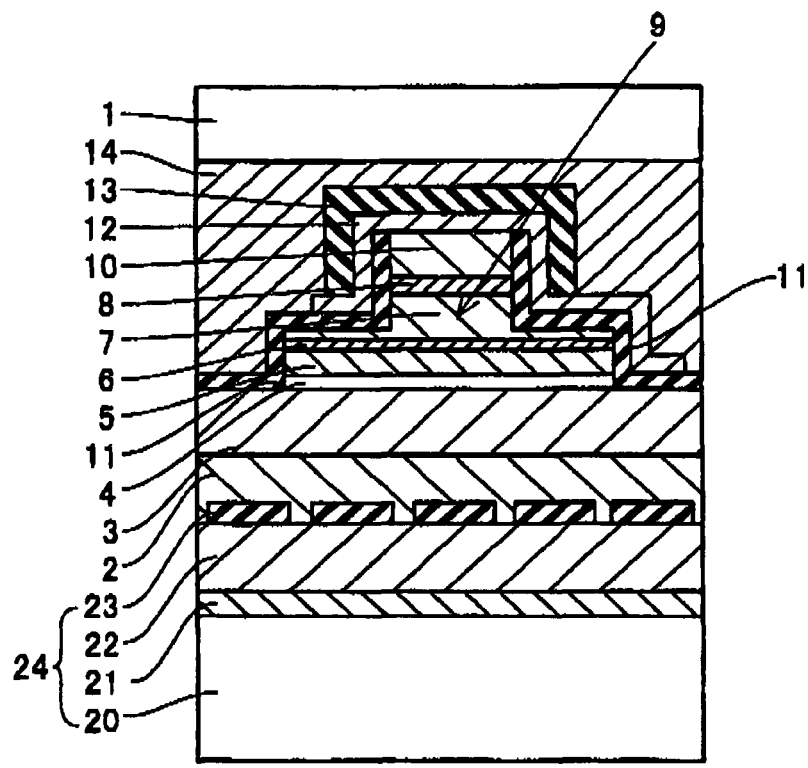
FIG. 17 is a cross-sectional view of the semiconductor laser device of the first embodiment illustrated in FIG. 5, taken along the line 2000-2000, for explaining the process of fabricating the semiconductor laser device.
Figure 18:
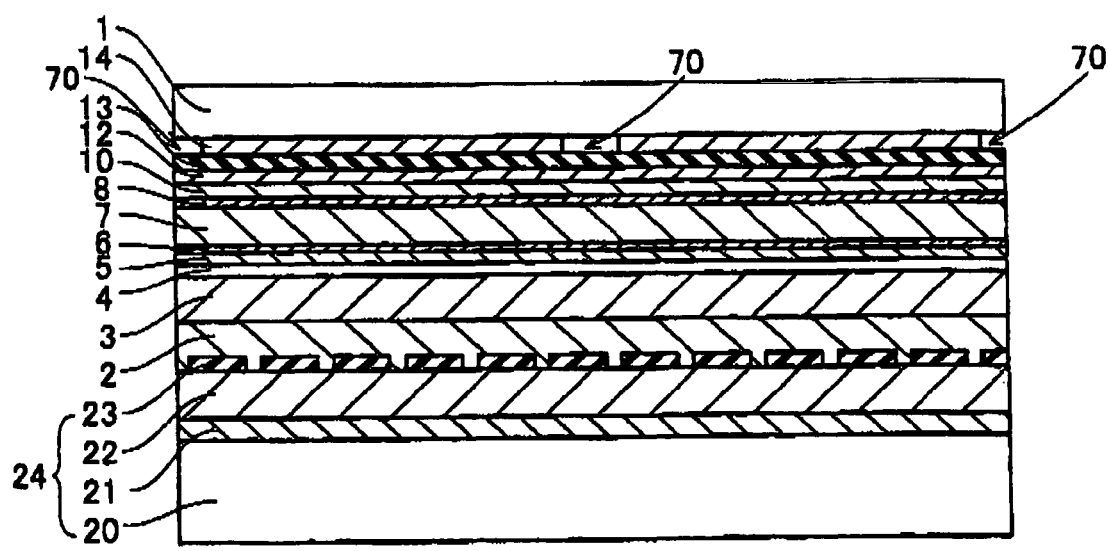
FIG. 18 is a cross-sectional view of the semiconductor laser device of the first embodiment illustrated in FIG. 5, taken along the line 1000-1000, for explaining the process of fabricating the semiconductor laser device.
Figure 19:
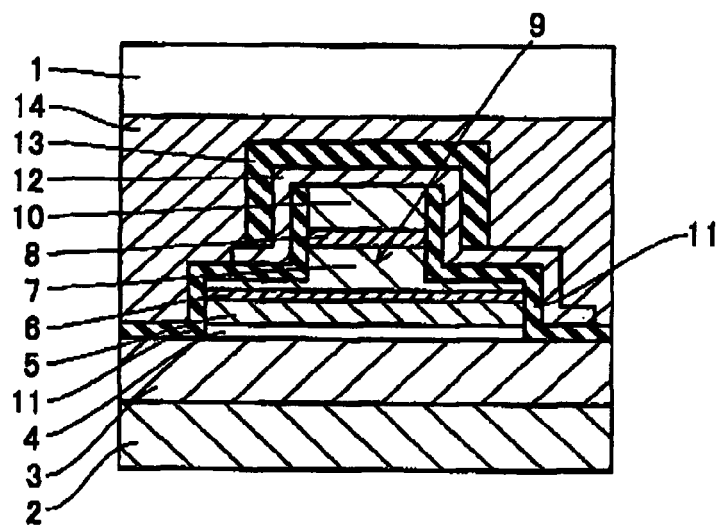
FIG. 19 is a cross-sectional view of the semiconductor laser device of the first embodiment illustrated in FIG. 5, taken along the line 2000-2000, for explaining the process of fabricating the semiconductor laser device.
Figure 20:
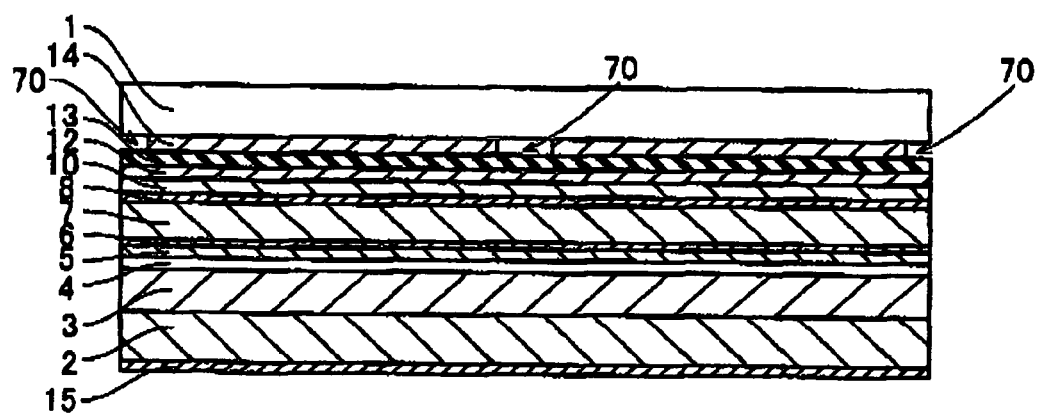
FIG. 20 is a cross-sectional view of the semiconductor laser device of the first embodiment illustrated in FIG. 5, taken along the line 1000-1000, for explaining the process of fabricating the semiconductor laser device.
Figure 21:
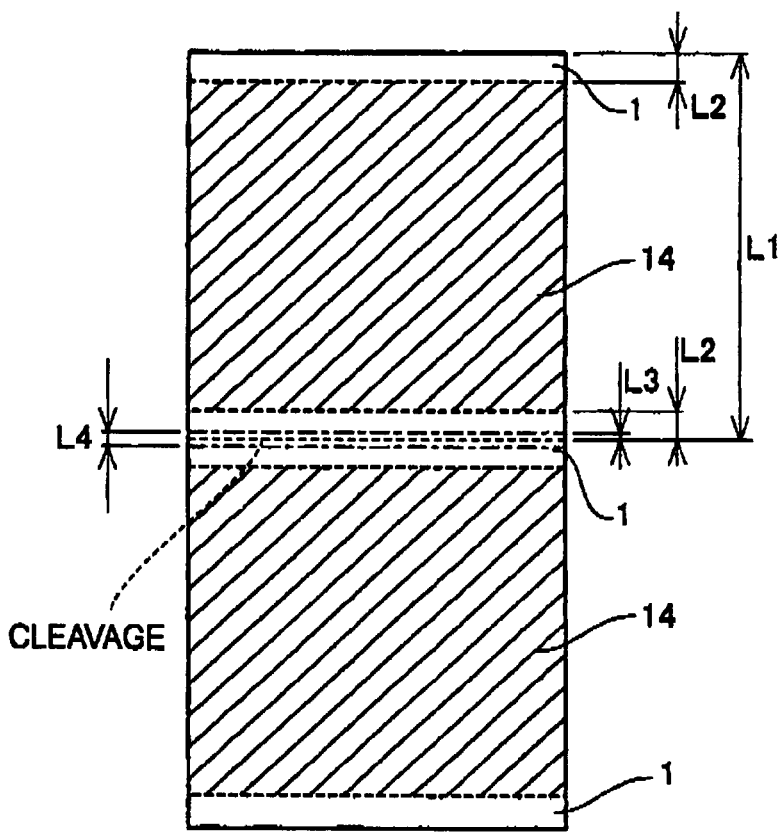
FIG. 21 is a plan view of the first embodiment illustrated in FIG. 5 for explaining the process of fabricating the semiconductor laser device.
Figure 22:
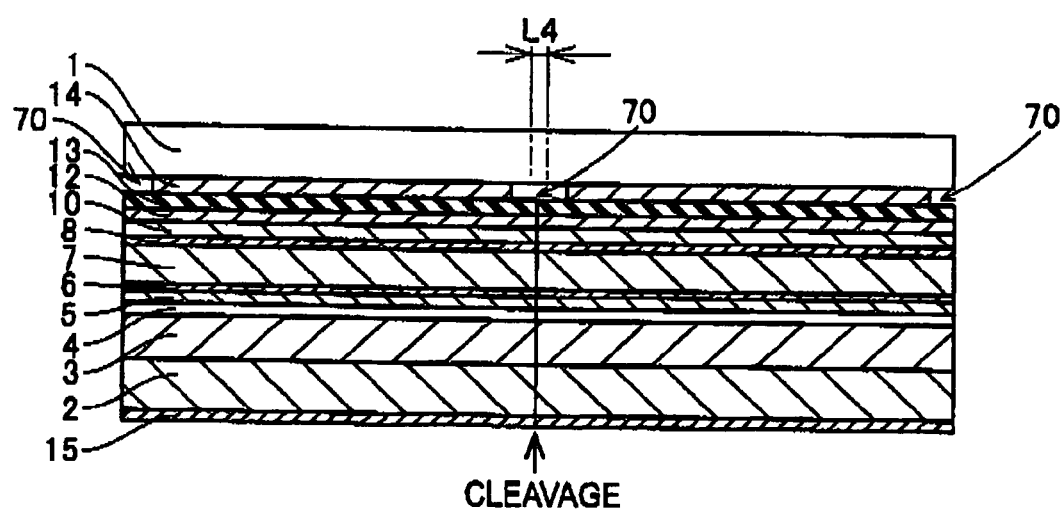
FIG. 22 is a cross-sectional view of the semiconductor laser device of the first embodiment illustrated in FIG. 5, taken along the line 1000-1000, for explaining the process of fabricating the semiconductor laser device.

FIGS. 9, 11 to 20 and 22 are cross-sectional views of the semiconductor laser device of the first embodiment illustrated in FIG. 5, and FIGS. 10 and 21 are plan views of the semiconductor laser device. All of the views are for explaining a process of fabricating the semiconductor laser device. By referring to FIGS. 5 to 22, descriptions will be provided below for the process of fabricating the semiconductor laser device of the first embodiment. Note that FIGS. 9, 11 to 17, and 19 show respectively cross-sections each taken along the same line as in the case of FIG. 7, and that FIGS. 18, 20 and 22 show respectively cross-sections each taken along the same line as in the case of FIG. 6.

First, as illustrated in FIG. 9, a buffer layer 21 and a GaN layer 22 are sequentially grown by MOCVD on a sapphire substrate 20 serving as a growth substrate. Note that the sapphire substrate 20 is an example of the "growth substrate" of the present invention.

Specifically, in a state where the sapphire substrate 20 is held at a growth temperature of approximately 600° C., the buffer layer 21 is grown on the (0001) plane of the sapphire substrate 20. The buffer layer 21 has a thickness of approximately 20 nm, and is made of GaN. Subsequently, in a state where the sapphire substrate 20 is held at the growth temperature of approximately 1050° C., a GaN layer 22 having a thickness of approximately 2 μm is grown on the buffer layer 21. Thereafter, as illustrated in FIG. 9, a mask 23, which is formed of an SiO$_2$ film, is formed on the GaN layer 22. The mask 23 consists of a triangular lattice pattern formed with openings 23a each having a diameter of approximately 2 μm with 10 μm intervals between the openings as illustrated in FIG. 10. The triangular lattice pattern is formed by use of a lithography technique generally used. A selective growth base 24 is configured of the sapphire substrate 20, the buffer layer 21, the GaN layer 22, and the mask 23.

Figure 11:
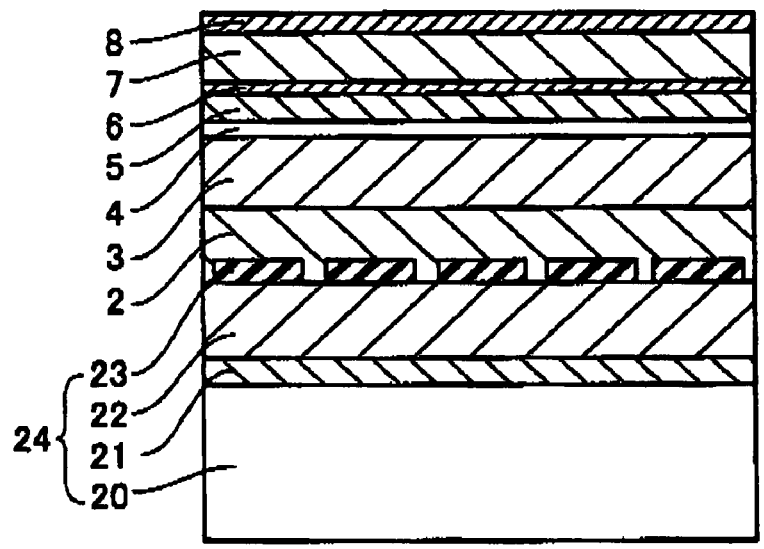
FIG. 11 is a cross-sectional view of the semiconductor laser device of the first embodiment illustrated in FIG. 5, taken along the line 2000-2000, for explaining the process of fabricating the semiconductor laser device.

As illustrated in FIG. 11, in a state where the sapphire substrate 20 is held at a growth temperature of approximately 1100° C., the n-type contact layer 2 and the n-type cladding layer 3 are sequentially grown on the selective growth base 24 by use of MOCVD. Subsequently, in a state where the sapphire substrate 20 is held in a growth temperature of approximately 800° C., the light emitting layer 4, the p-type light guiding layer 5 and the p-type cap layer 6 are sequentially grown on the n-type cladding layer 3. Thereafter, in a state where the sapphire substrate 20 is held at the growth temperature of approximately 1100° C., the p-type cladding layer 7, which has a thickness of approximately 400 nm, is grown on the p-type cap layer 6. Then, in a state where the sapphire substrate 20 is held at the growth temperature of approximately 800° C., the p-type contact layer 8 is grown on the p-type cladding layer 7. Each of the layers from the GaN layer 22 to the p-type contact layer 8 has the surface, which faces the sapphire substrate 20, and which has N-polarity, and crystals of each of the above layers grow with Ga-polarity. In addition, since the n-type contact layer 2 is grown laterally on the mask 23, the dislocation density of the n-type contact layer 2 is reduced. As a result, the dislocation density of the layers from the n-type cladding layer 3 to the p-type contact layer 8, which are formed on the n-type contact layer 2, is reduced. Thereafter, in the state of being held at the growth temperature of approximately 800° C., the sapphire substrate 20 is annealed in an N$_2$ atmosphere to activate acceptors of the p-type nitride semiconductor layer. Accordingly, a predetermined hole concentration is obtained.

Figure 12:
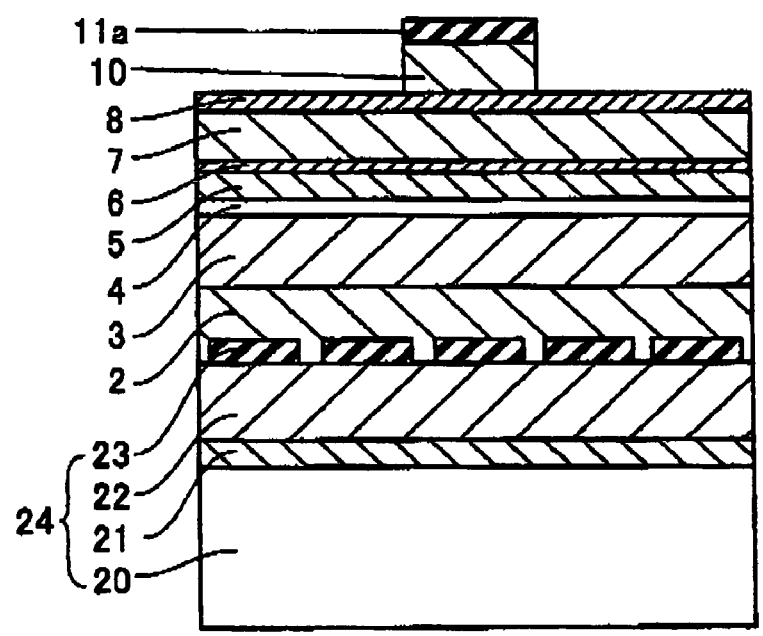
FIG. 12 is a cross-sectional view of the semiconductor laser device of the first embodiment illustrated in FIG. 6, taken along the line 2000-2000, for explaining the process of fabricating the semiconductor laser device.

Subsequently, the p-type ohmic electrode 10 and an insulating film 11a which has a thickness of 0.25 μm, and which is made of SiO$_2$, are sequentially formed on the surface of the p-type contact layer 8 by vacuum evaporation or the like. Thereafter, the p-type ohmic electrode 10 and the insulating film 11a are subjected to patterning, and hence the p-type ohmic electrode 10 and the insulating film 11a respectively having shapes illustrated in FIG. 12 are obtained. The p-type ohmic electrode 10 is configured of the Pt, Pd and Au layers which respectively have thicknesses of approximately 5 μm, approximately 100 μm and approximately 150 nm, and which are formed in order from the lower tier to the upper tier.

Figure 13:
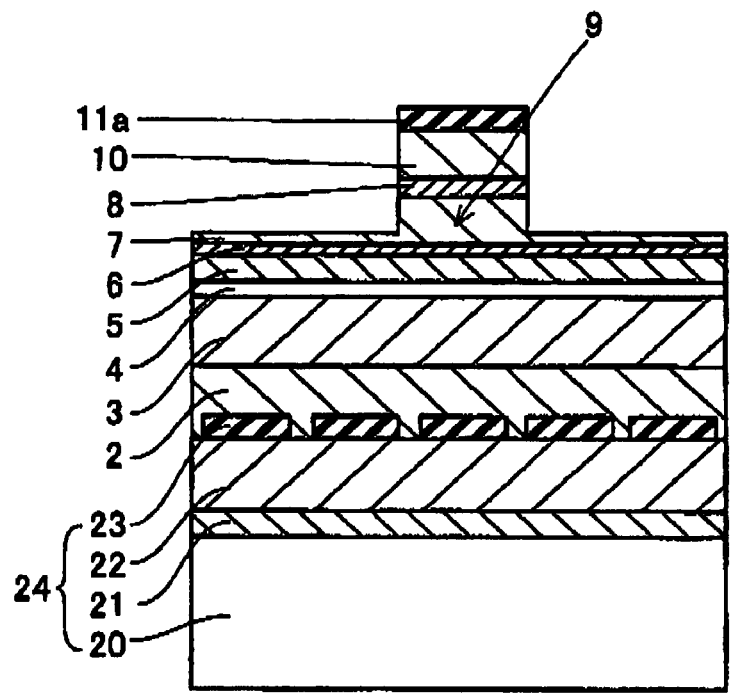
FIG. 13 is a cross-sectional view of the semiconductor laser device of the first embodiment illustrated in FIG. 5, taken along the line 2000-2000, for explaining the process of fabricating the semiconductor laser device.
Figure 14:
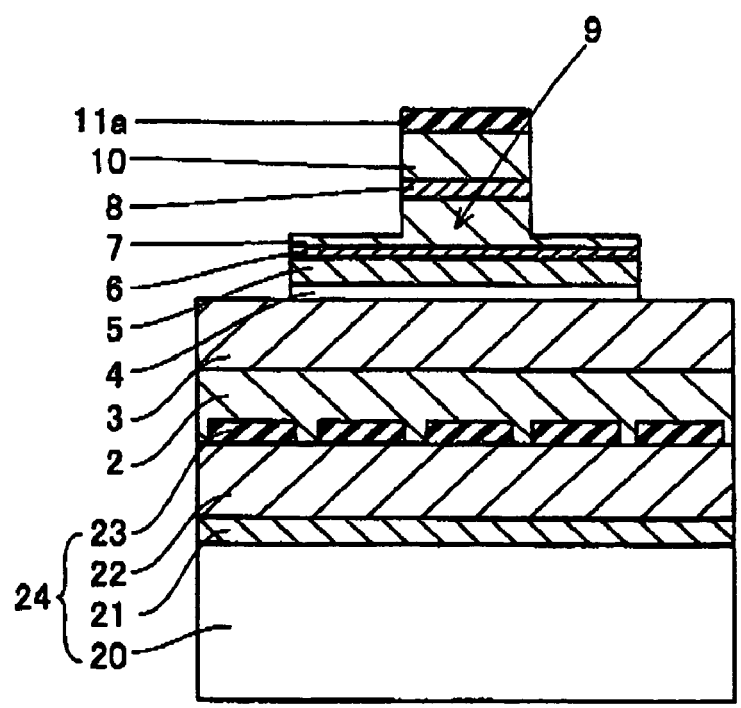
FIG. 14 is a cross-sectional view of the semiconductor laser device of the first embodiment illustrated in FIG. 5, taken along the line 2000-2000, for explaining the process of fabricating the semiconductor laser device.
Figure 15:
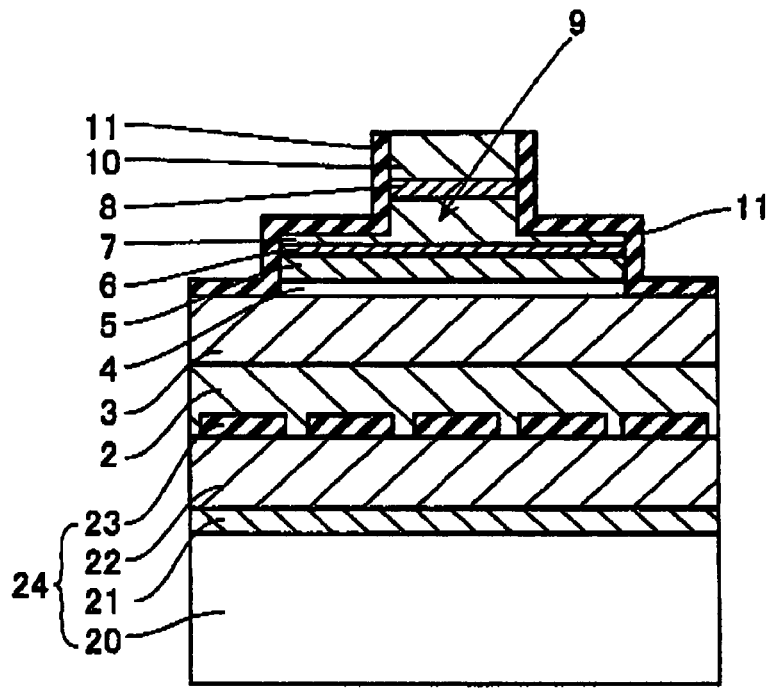
FIG. 15 is a cross-sectional view of the semiconductor laser device of the first embodiment illustrated in FIG. 5, taken along the line 2000-2000, for explaining the process of fabricating the semiconductor laser device.

Thereafter, as illustrated in FIG. 13, in a state where the sapphire substrate 20 is held at approximately 200° C., portions of the p-type contact layer 8 and of the cladding layer 7 are removed by dry etching with a Cl$_2$ gas, using the insulating film 11a as a mask. Accordingly, the ridge 9 is formed. The width and height of the ridge 9 are respectively approximately 1.5 μm and approximately 380 nm. Subsequently as illustrated in FIG. 14, portions of the light emitting layer 4, the light guiding layer 5, the p-type cap layer 6 and the flat portion of the p-type cladding layer 7 are etched, and thus each of the light emitting layer 4, the light guiding layer 6, the p-type cap layer 6 and the p-type cladding layer 7 is subjected to patterning so as to have a width of approximately 4.5 μm, by means of photolithography and dry-etching techniques. Thereafter, as illustrated in FIG. 15, the insulating film 11 which has a thickness of approximately 250 nm, and which is made of SiN, is formed so that the insulating film 11 covers the upper surface of the n-type cladding layer 3, the side surfaces of the light emitting layer 4, the side surfaces of the light guiding layer 5, the side surfaces of the p-type cap layer 6 and the side surfaces of the flat portion of the p-type cladding layer 7, the upper surface of the flat portion of the p-type cladding layer 7, the side surfaces of the ridge 9, and the upper surface of the insulating layer 11a. After that, only a portion of the insulating 11a and the insulating film 11, which are on the p-type ohmic electrode 10, are removed.

Subsequently, as illustrated in FIG. 16, the p-type pad electrode 12 is formed on the p-type ohmic electrode 10 and the insulating film 11. The p-type pad electrode 12 consists of the Ti, Pd and Au layers which respectively have the thicknesses of approximately 100 nm, approximately 100 nm and approximately 3000 nm, and which are respectively formed from the p-type ohmic electrode 10 and the insulating film 11 in order from the lower tier to the upper tier. Thereafter, the insulating film 13 is formed on the p-type pad electrode 12. The insulating film 13 has the thickness of approximately 100 nm, and is made of SiO$_2$. Then, as illustrated in FIG. 17, the semiconductor laser device portion 50 is caused to adhere to the supporting substrate 1 with the solder layer 14 interposed in between. The supporting substrate 1 has the thickness of approximately 5 μm, and is made of AuSn.

In the first embodiment, as illustrated in FIG. 21, the solder layer 14 is previously subjected to patterning on the surface of the supporting substrate 1, the surface facing the semiconductor laser device portion 50. In addition, as illustrated in FIG. 18, the semiconductor laser device portion 50 and the supporting substrate 1 are adhered to each other (fuse) so that there exist the gaps 70 each of which is the area where no solder layer 14 exists. The selective growth base 24 is then removed by dry-etching to expose the entire surface of the n-type contact layer 2, the surface being opposite to the surface closer to the supporting substrate 1, and thus the shape illustrated in FIGS. 19 and 20 is obtained.

Then, as illustrated in FIG. 20, the n-type electrode 15 is formed on the back surface of the n-type contact layer 2. The n-type contact electrode 15 includes the n-type ohmic electrode with a thickness of 10 nm, the n-type barrier metal with a thickness of 20 nm, and the n-type pad electrode with a thickness of 300 nm, which are respectively made of Al, Pt and Au, and which are formed in order from the lower tier to the upper tier.

As illustrated in FIGS. 21 and 22, grooves for scribing (not illustrated) are provided to the surface of the semiconductor laser device portion 50 perpendicular to the main surface of the supporting substrate 1, in order to cleave the semiconductor laser device portion 50 along the (1-100) plane of the semiconductor laser device portion 50 by use of ultrasonic waves.

In the first embodiment, the semiconductor laser device portion 50 is cleaved along the cleavage planes of the semiconductor laser device portion 50, from the gaps 70 which are respectively near the ends of the areas serving as the cleavage planes of the semiconductor laser device portion 50, and in which no solder layers 14 exist.

Finally, as illustrated in FIGS. 21 and 22, the semiconductor laser device portions 50 is split by dicing only the supporting substrate 1 along the area in which no adhesive layers exist, to remove a portion thereof having a width (L4) of approximately 40 μm. Accordingly, the semiconductor laser device of the first embodiment illustrated in FIG. 5 is formed.

As described above, the method of fabricating a semiconductor laser device of the first embodiment includes the steps of: causing the semiconductor laser device portion to adhere to the surface of the supporting substrate with the adhesive layer interposed in between; and forming the first area where no solder layer exists near the end of the area serving as the cavity surface of the semiconductor laser device portion, the end being closer to the supporting substrate. Thereby, the areas where no solder layers exist can be formed respectively near the ends of the cavity surfaces of the semiconductor laser device portion, the ends being closer to the supporting substrate. In addition, since the method includes the step of forming the pair of cavity surfaces near the first area, the semiconductor laser device portion can be cleaved in a position of the semiconductor laser device portion. The position corresponds to the area with which the supporting substrate and the semiconductor laser device portion are separated from each other. Hence, the semiconductor laser device portion can be cleaved without influence from the cleavability of the supporting substrate. As a consequence, it is made possible to improve the flatness of the cleavage plane of the semiconductor laser device portion.

In the first embodiment, the step of forming the first area preferably includes a step of forming, by patterning, the adhesive layer in an area on the surface of the supporting substrate except for the first region. With such a configuration, the areas where no adhesive layers exist can be formed on the surface of the supporting substrate because the adhesive layer is formed by patterning. Accordingly, the areas where no adhesive layers exist can be easily formed respectively near the ends of the cavity surfaces of the semiconductor laser device portion when the supporting substrate and the semiconductor laser device portion are adhered to each other, the ends being closer to the supporting substrate.

It is preferable that the method of fabricating a semiconductor laser device of the first embodiment further include the steps of: forming the semiconductor laser device portion by use of a growth substrate; and removing the growth substrate after the step of forming the first area. With such a configuration, the semiconductor laser device portion can be easily cleaved even in a case where the growth substrate has poor cleavability.

And, as described above, the first embodiment includes the step of splitting the supporting substrate 1 along the area in which no adhesive layers exist, which is carried out after the step of forming the pair of cavity surfaces 60 in the semiconductor laser device portion 50. Thus, the supporting substrate 1 is not split when the cavity surfaces 60 are formed. For this reason, the steps necessary for the cleaving can be performed easily in the first embodiment. For instance, the grooves for scribing can be aligned easily when the grooves are formed.

Second Embodiment

Figure 23:
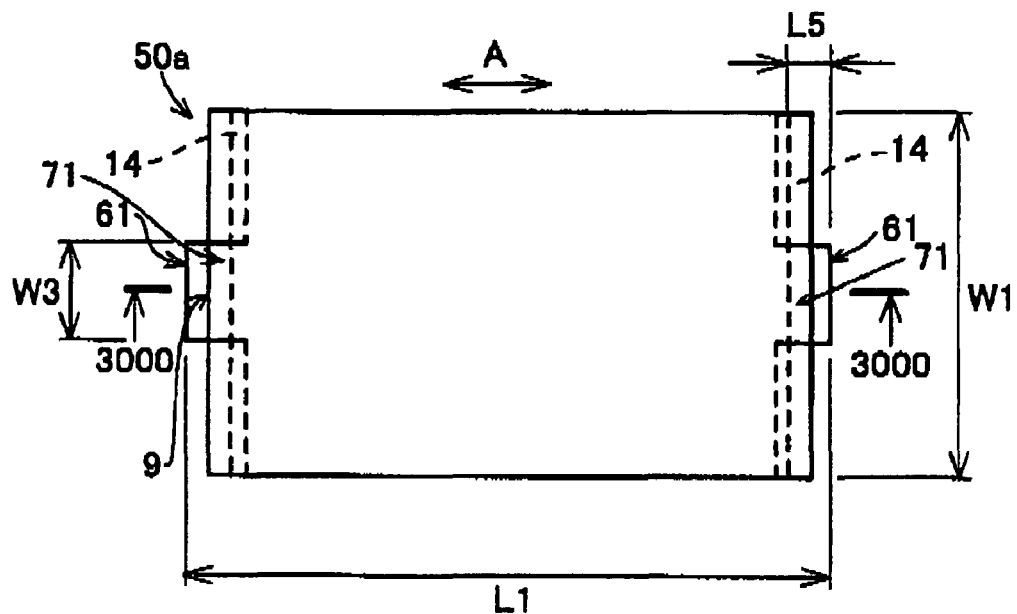
FIG. 23 is a plan view of a semiconductor laser device of a second embodiment of the present invention.
Figure 24:
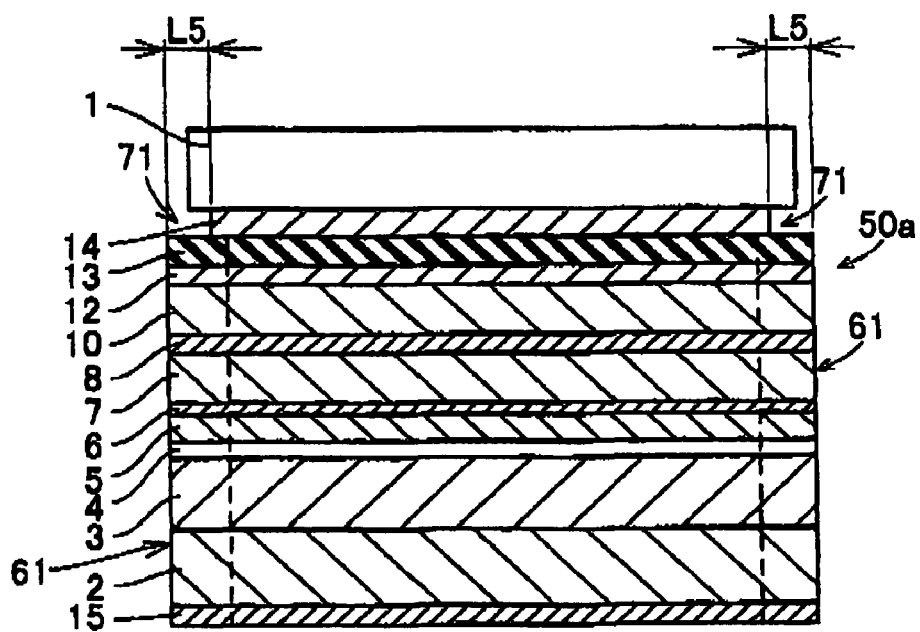
FIG. 24 is a cross-sectional view of the semiconductor laser device of the second embodiment illustrated in FIG. 23, taken along the line 3000-3000.
Figure 25:
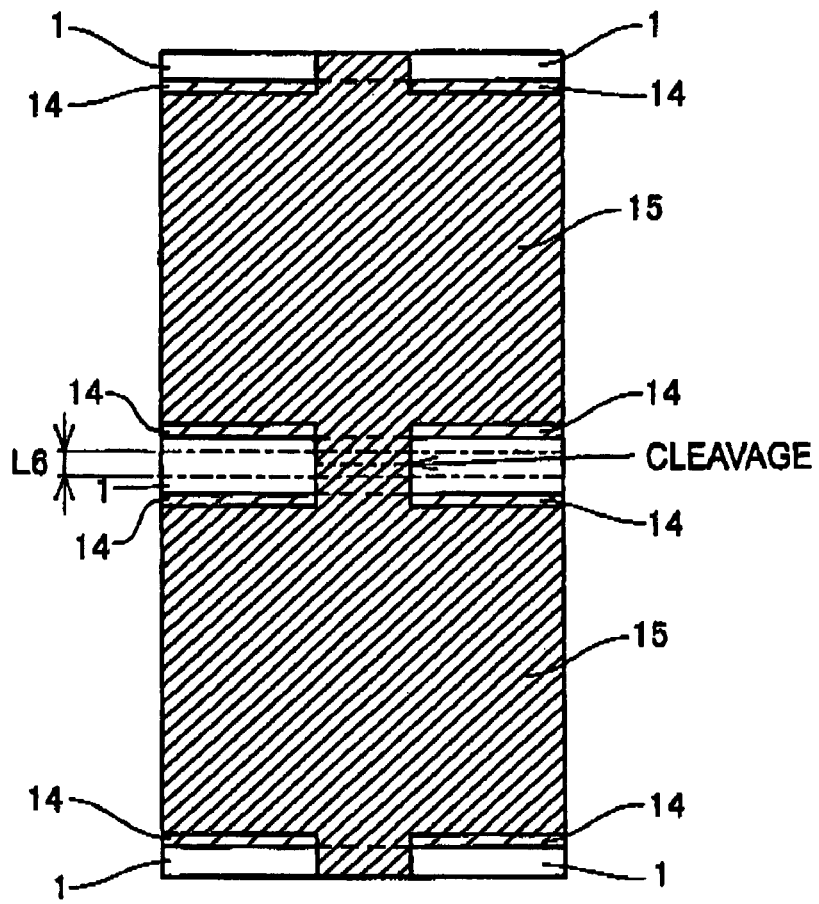
FIG. 25 is a plan view of the semiconductor laser dice of the second embodiment illustrated in FIG. 23 before the semiconductor laser device is split.

FIG. 23 is a plan view of a semiconductor laser device of a second embodiment of the present invention. FIG. 24 is a cross-sectional view of the semiconductor laser device of the second embodiment illustrated in FIG. 23, taken along the line 3000-3000. FIG. 25 is a plan view of the semiconductor laser device of the second embodiment illustrated in FIG. 23 in a state before the semiconductor laser device is split. By referring to FIGS. 23 to 25, descriptions will be provided for an example of the second embodiment different from the first embodiment in that, in the second embodiment, cleavage planes (cavity surfaces 61) are formed by causing only a ridge 9, in which the cleavage planes are formed, and the area below the ridge to protrude from the side surfaces of a semiconductor laser device portion 50a. Except for the point described above, the configuration of the second embodiment is similar to that of the first embodiment.

In the second embodiment, the semiconductor laser device portion 50a is caused to adhere to a electric conductive supporting substrate 1, which is made of AuSn having no cleavability, with a electric conductive solder layer 14 made of AuSn interposed in between. The semiconductor laser device portion 50a has the identical configuration to that in the semiconductor laser device portion 50 of the first embodiment, except that the cavity surfaces 61 in the two device portions are different from each other.

In the second embodiment, as illustrated in FIG. 23, the ridge 9 and the area below the ridge 9 of the side surfaces of the semiconductor laser device portion 50a are formed to protrude from the side surfaces of the semiconductor laser device portion 50a in the direction in which the ridge 9 extends (the direction indicated by the arrow A in FIG. 23). Incidentally, the width W3 of the ridge 9 and the area below the ridge 9 is approximately 10 μm. As illustrated in FIGS. 24 and 25, the ridge 9 and the area below the ridge 9 of the semiconductor laser device 50a are cleaved. Thereby, the cavity surfaces 61, which the cleavage planes constitute, are formed on the side surfaces of the ridge 9 and the area below the ridge 9. As illustrated in FIG. 24, gaps 71, each of which is an area where no solder layer 14 exists, are formed respectively near the ends of the cavity surfaces 61, the ends being closer to the supporting substrate 1. As illustrated in FIGS. 23 and 24, the gaps 71, which are the areas where no solder layer 14 exists, are formed so that the gaps 71 each occupy the space extending inward for approximately 30 µm (L5) from the line along which the cavity surfaces 61 exten.

In the second embodiment, as described above, the cavity surfaces 61, which the cleavage planes constitute can be easily formed in the side surfaces of the ridge 9 and the area below the ridge 9 in the following way. The ridge 9 and the area below the ridge 9 are formed to protrude from the side surfaces of the semiconductor laser device portion 50a in the direction in which the ridge 9 extends. Concurrently, the cavity surfaces 61 are formed in the side surfaces of the ridge 9 and the area below the ridge 9. Accordingly, the ridge 9 and the area below the ridge 9, of which width to be cleaved are narrow, are cleaved, the ridge 9 and the area protruding in the direction in which the ridge 9 extends.

Note that other effects in the second embodiment are similar to those in the first embodiment.

Next, by referring to FIGS. 24 and 26, descriptions will be provided below for a method of fabricating the semiconductor laser device of the second embodiment.

First, by the similar process to that of the first embodiment, the semiconductor laser device portion 50a and the supporting substrate 1 are adhered to each other with the solder layer 14 interposed in between. As illustrated in FIGS. 24 and 25, portions except for the ridge 9 and the area below the ridge 9 of the side end face of the semiconductor laser device portion 50a, in which the cleavage planes are formed, are etched from the electrode 15 to expose portions of the surface of the supporting substrate 1 and of the solder layer 14. Thereafter, only a portion of the semiconductor laser device 50 is cleaved along the (1-100) plane perpendicular to the main surface of the supporting substrate 1, the portion being interposed between the areas, in each of which the portion except for the ridge 9 and the area below the ridge 9 are etched and removed.

Subsequently, as illustrated in FIG. 25, the semiconductor laser device is split by dicing only the supporting substrate 1 to remove a portion thereof having a width L6 of approximately 40 µm. Accordingly, the semiconductor laser device of the second embodiment illustrated in FIG. 23 is formed.

Third Embodiment

Figure 26:
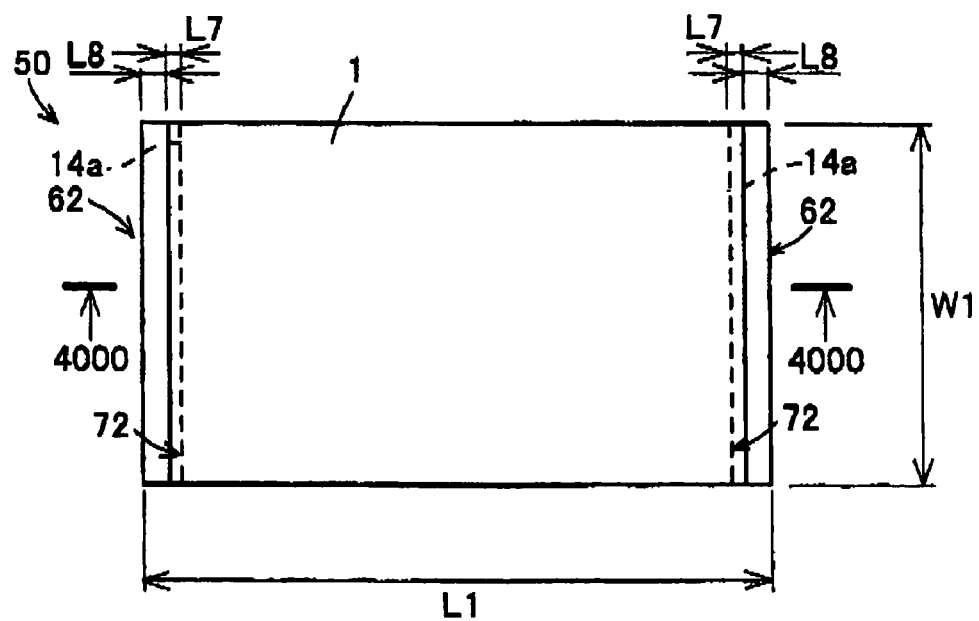
FIG. 26 is a plan view of a semiconductor laser device of a third embodiment of the present invention.
Figure 27:
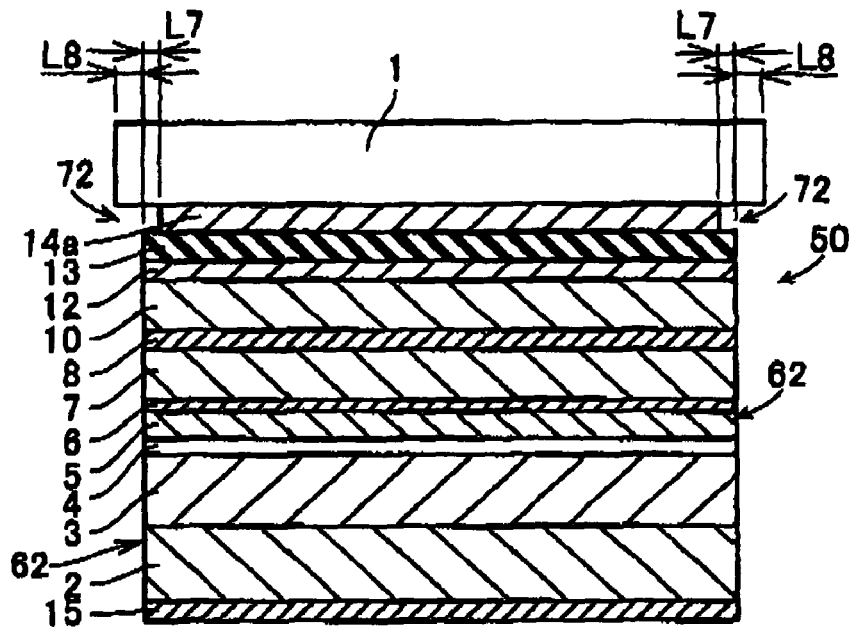
FIG. 27 is a cross-sectional view of the semiconductor laser device of the third embodiment illustrated in FIG. 26, taken along the line 4000-4000.

FIG. 26 is a plan view of a semiconductor laser device of a third embodiment of the present invention. FIG. 27 is a cross-sectional view of the semiconductor laser device of the third embodiment illustrated in FIG. 26, taken along the line 4000-4000. By referring to FIGS. 26 and 27, descriptions will be provided for an example of the third embodiment. In the example, the width of each of gaps 72 formed in a supporting substrate 1 is previously set wider than that in the first embodiment. Each of the gaps 72 is an area where no solder layer 14a exists. Because of the wider width, it is made possible to cleave semiconductor laser device portion 60 after the supporting substrate 1 and the semiconductor laser device portion 50 are diced. Other aspects of the configuration of the third embodiment are similar to those of the first embodiment.

In the third embodiment, as illustrated in FIGS. 26 and 27, a semiconductor laser device portion 50 identical to the semiconductor laser device 50 in the first embodiment is caused to adhere to a electric conductive supporting substrate 1, which is made of Cu—W having no cleavability, with a electric conductive solder layer 14a of AuSn which is interposed in between. As illustrated in FIG. 27, gaps 72, each of which is an area where no solder layer 14 exists, are formed respectively near the ends of the cavity surfaces 62 which cleavage planes constitute, the ends being closer to the supporting substrate 1. The gaps 72 are formed so that each of the gaps 72 occupies the space extending inward for approximately 5 µm (L7) from the line along which the cavity surfaces 62 extend. The supporting substrate 1 is formed so that the side surfaces of the supporting substrate 1 respectively jut out of the line, along which the cavity surfaces 62 extend, by only approximately 10 µm.

As described above, in the third embodiment, the semiconductor laser device has the following configuration. The semiconductor laser device includes the supporting substrate 1, the semiconductor laser device portion 50 which is formed on the surface of the supporting substrate 1, and which has the pair of cavity surfaces 62, and the solder layer 14a for adhering the supporting substrate 1 and the semiconductor laser device portion 50 to each other. The semiconductor laser device also includes the gaps 72, each of which is the area where no solder layer 14a exists, and which are formed respectively near the ends of the cavity surfaces 62 of the semiconductor laser device portion 50, the ends being closer to the supporting substrate 1. With this configuration, the semiconductor laser device portion 50 is cleaved from the areas corresponding to the gaps 72, and accordingly it is made possible to improve the flatness of the cleavage planes of the semiconductor laser device portion 60.

Incidentally, other effects of the third embodiment are similar to those of the first embodiment.

Figure 28:
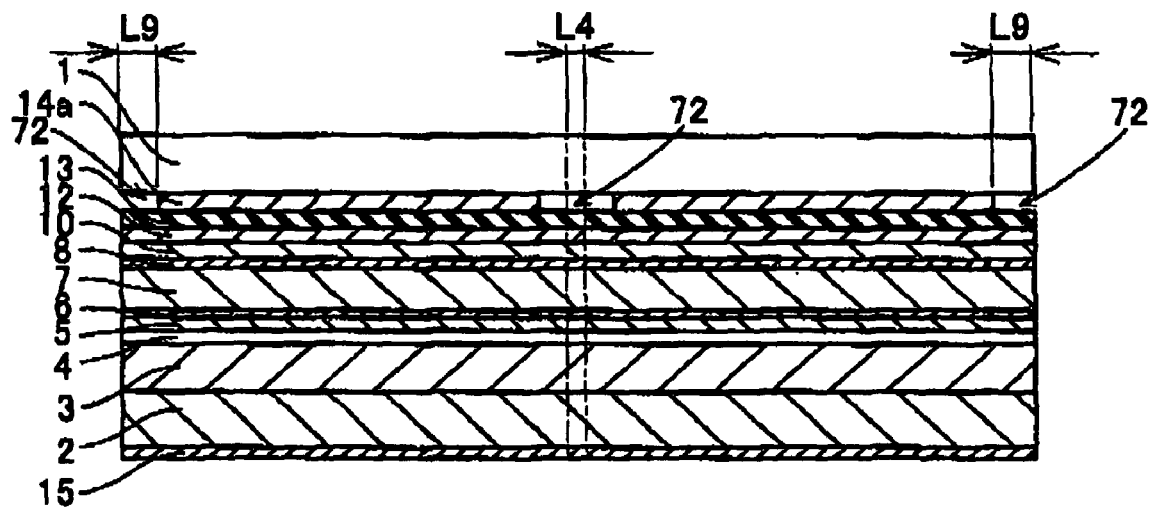
FIG. 28 is a cross-sectional view of the semiconductor laser device of the third embodiment illustrated in FIG. 26, taken along the line 4000-4000, for explaining a process of fabricating the semiconductor laser device.
Figure 29:
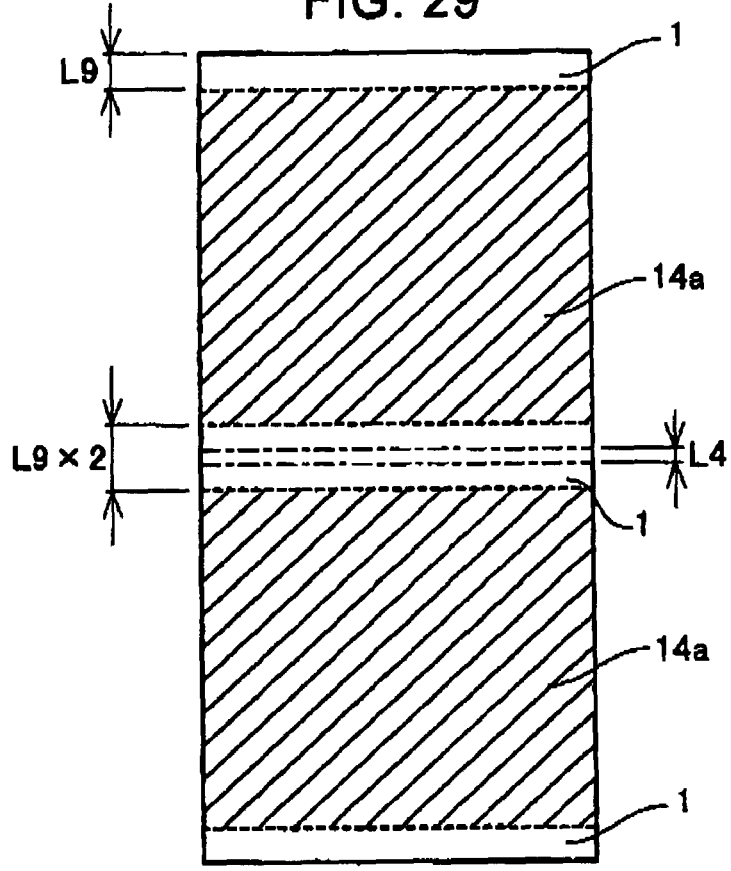
FIG. 29 is a plan view of the semiconductor laser device of the third embodiment illustrated in FIG. 26, for explaining the process of fabricating the semiconductor laser device.
Figure 30:
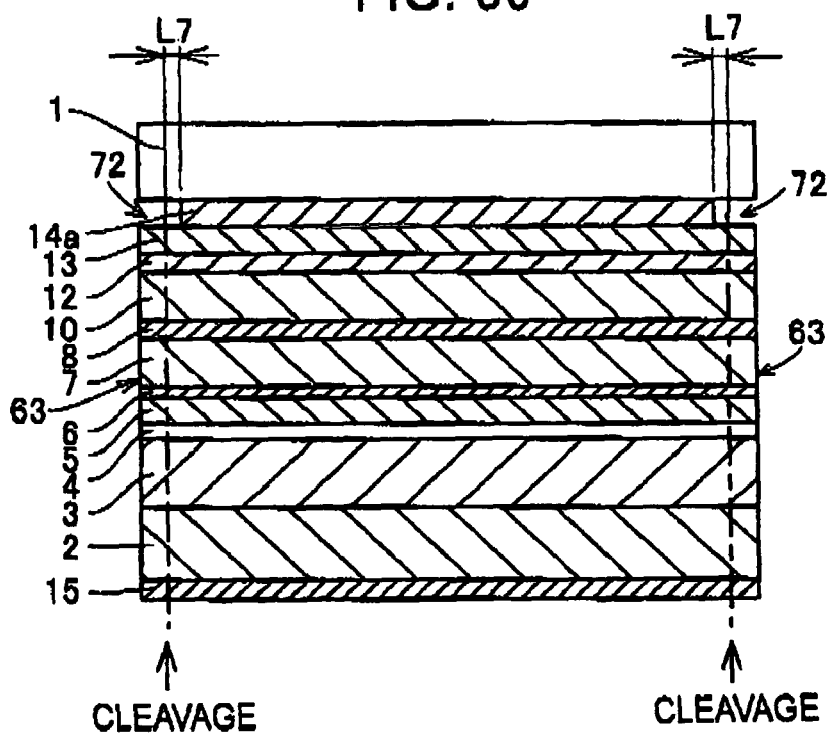
FIG. 30 is a cross-sectional view of the semiconductor laser device of the third embodiment illustrated in FIG. 26, taken along the line 4000-4000, for explaining the process of fabricating the semiconductor laser device.

FIGS. 28 and 30 are cross-sectional views, and FIG. 29 is a plan view, for explaining a process of fabricating the semiconductor laser device of the third embodiment illustrated in FIG. 26. By referring to FIGS. 26 to 30, descriptions will be provided for the method of fabricating the semiconductor laser device of the third embodiment.

First, by a fabrication process similar to that in the first embodiment, the semiconductor laser device portion 50 is formed, and then the semiconductor laser device portion 50 and the supporting substrate 1 are adhered to each other with the solder layer 14a interposed in between, as illustrated in FIG. 28. In this event, as illustrated in FIGS. 28 and 29, a plurality of solder layers 14a made of AuSn are previously formed on the supporting substrate 1 by patterning so that the solder layers 14a are formed at intervals (2×L9) of approximately 70 µm. Accordingly, the interval (2×L9) between the solder layers 14a is wider than that (2×L2=approximately 50 µm) of the first embodiment (refer to FIG. 21). Hence, even when the semiconductor laser device 50 is diced before being cleaved, there still remains areas from which the semiconductor laser device portion 50 is cleaved.

Subsequently, as illustrated in FIG. 29, the supporting substrate 1 and the semiconductor laser device portion 50 are split by dicing the semiconductor laser device so that portions each having a width (L4) of approximately 40 µm are removed along the area in which adhesive layers exist as in the case of the first embodiment. After the supporting substrate 1 and the semiconductor laser device portion 50 are split, each of the semiconductor laser device portions 50 is cleaved along the lines each positioned approximately 10 µm inward from the split surface 63 of the semiconductor laser device 50 (positioned approximately 5 µm outward from the solder layer 14a) as illustrated in FIG. 30. Thereby, the cavity surfaces 62 (refer to FIG. 27), which the cleavage planes constitute, are formed. Accordingly, the semiconductor laser device of the third embodiment illustrated in FIG. 26 is formed.

As described, the third embodiment includes the step of splitting the supporting substrate 1 and the semiconductor laser device portion 50 along the area in which no adhesive layers exist, which is carried out before the step of forming the pair of cavity surfaces 62 in the semiconductor laser device portion 50. With this step, the supporting substrate 1 and the semiconductor laser device portion 50 are split before the semiconductor laser device portion 50 is cleaved. Hence, the cleavage planes of the semiconductor laser device portion 50 can be prevented from being damaged when the supporting substrate 1 and the semiconductor laser device portion 50 are split.

Incidentally, other effects of the third embodiment are similar to those in the first embodiment.

Fourth Embodiment

Figure 31:
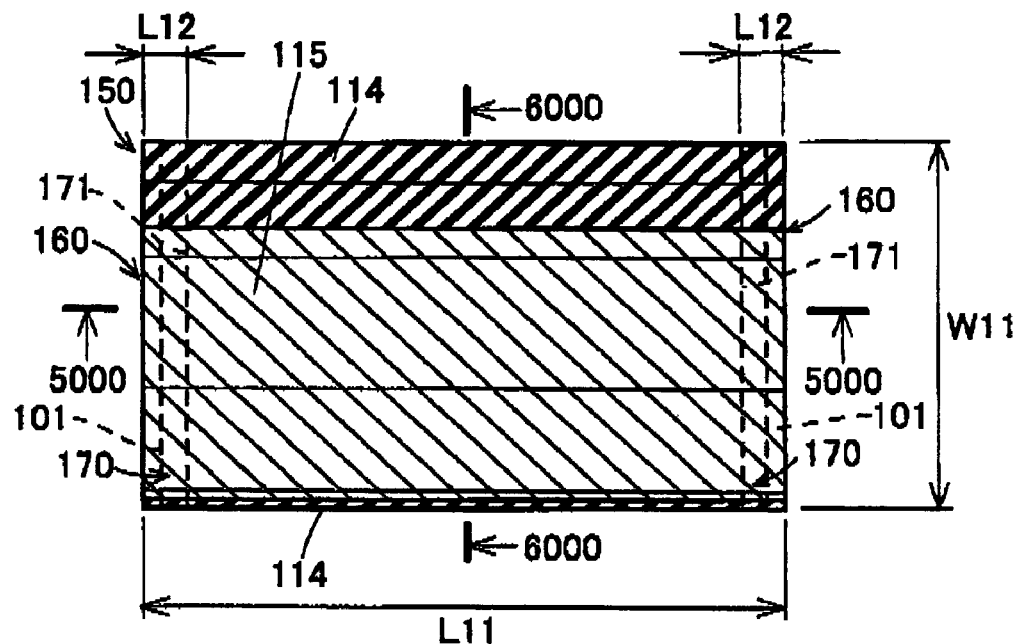
FIG. 31 is a plan view of a semiconductor laser device of a fourth embodiment of the present invention.
Figure 32:
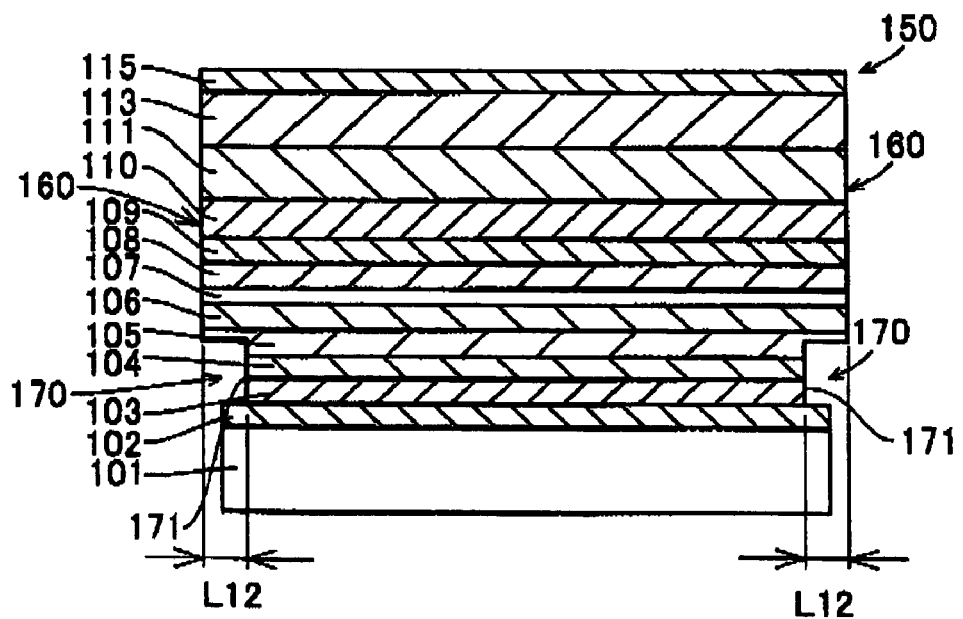
FIG. 32 is a cross-sectional view of the semiconductor laser device of the fourth embodiment illustrated in FIG. 31, taken along the line 5000-5000.
Figure 33:
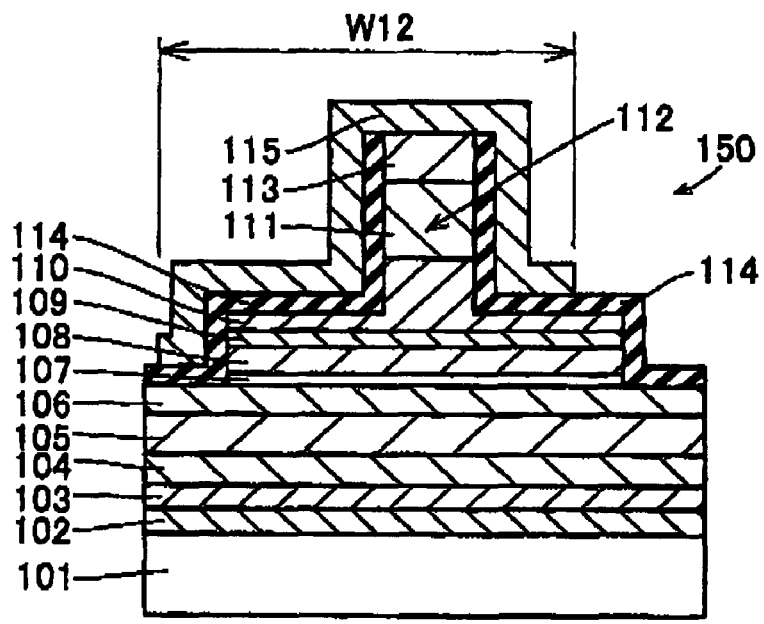
FIG. 33 is a cross-sectional view of the semiconductor laser device of the fourth embodiment illustrated in FIG. 31, taken along the line 6000-6000.
Figure 34:
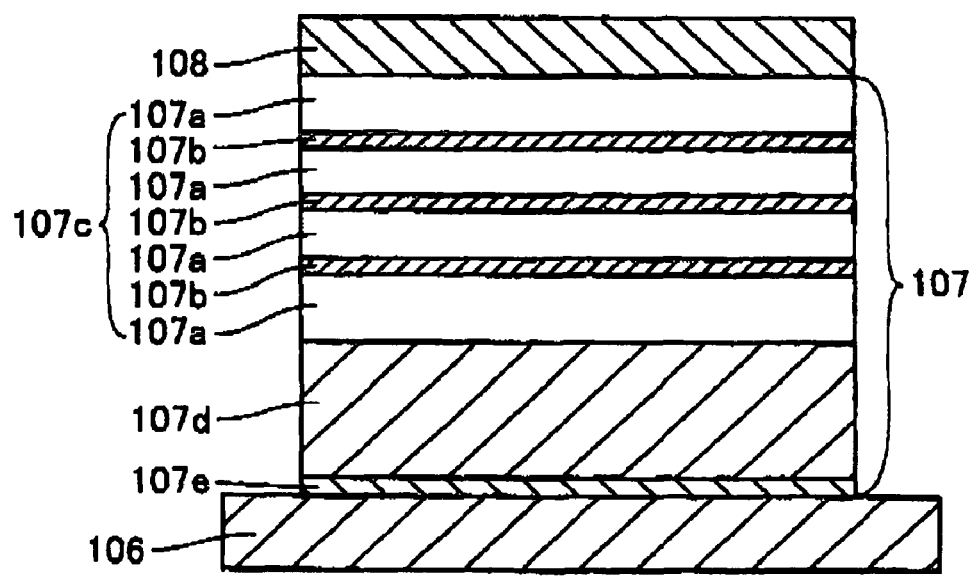
FIG. 34 is a cross-sectional view of a structure of a light emitting layer of the semiconductor laser device of the fourth embodiment illustrated in FIG. 31.

FIG. 31 is a plan view of a semiconductor laser device of a fourth embodiment of the present invention. FIG. 32 is a cross-sectional view of the semiconductor laser device of the fourth embodiment illustrated in FIG. 31, taken along the line 5000-5000. FIG. 33 is a cross-sectional view of the semiconductor laser device of the fourth embodiment illustrated in FIG. 31, taken along the line 6000-6000. FIG. 34 is a cross-sectional view of a structure of a light emitting layer of the semiconductor laser device of the fourth embodiment illustrated in FIG. 31. By referring to FIGS. 31 to 34, descriptions will be provided for the following configuration of the semiconductor laser device of the fourth embodiment. Unlike the cases of the first to third embodiments, the surface of a semiconductor laser device portion 150 is etched to provide a step portion 171 (FIG. 32), the surface facing the supporting substrate 101. Note that the step portion 171 is an example of a "first step portion" of the present invention.

In the semiconductor laser device of the fourth embodiment, as illustrated in FIGS. 31 and 32, the supporting substrate 101 and the semiconductor laser device portion 150 are adhered to each other with a solder layer 102 interposed in between so that an n-type semiconductor layer of the semiconductor laser device portion 150 faces the supporting substrate 101. In the fourth embodiment, a p-type semiconductor layer of the semiconductor laser device portion 150 is formed on the side of the semiconductor laser device portion 150 opposite to that closer to the supporting substrate 101. Note that the solder layer 102 is an example of the "adhesive layer" of the present invention. As illustrated in FIGS. 31 and 32, a pair of cavity surfaces 160, which cleave surfaces constitute, are formed in the semiconductor laser device portion 150. As illustrated in FIG. 31, the semiconductor laser device has a length L11 of approximately 600 μm and a width W11 of approximately 400 μm.

In the fourth embodiment, as illustrated in FIG. 32, gaps 170, in each of which no solder layer 102 exists, are formed near ends of the respective cavity surfaces 160 of the semiconductor laser device portion 150, the ends being closer to the supporting substrate 101. The gaps 170 where no solder layer exists are formed so that the gaps 170 occupy the space extending inward for approximately 25 μm (L12) from the lines extending respectively from the cavity surfaces 160.

In the semiconductor laser device of the fourth embodiment, as illustrated in FIG. 33, the electric conductive solder layer 102 is formed on the entire surface of the electric conductive supporting substrate 101. The solder layer 102 has a thickness of approximately 3000 nm, and is made of AuSn. The supporting substrate 101 has a thickness of approximately 300 μm, and is made of Cu—W having no cleavability. An n-type pad electrode 103 is formed on the semiconductor layer 102. The n-type pad electrode 103 consists of Au and Pt layers which respectively have thicknesses of approximately 3000 nm and approximately 20 nm, and which are formed in order from the lower tier to the upper tier. An n-type ohmic electrode 104 is formed on the n-type pad electrode 103. The n-type ohmic electrode 104 has a thickness of approximately 10 nm, and is made of Al. An n-type contact layer 105 is formed on the n-type ohmic electrode 104. The n-type contact layer 106 has a thickness of approximately 10 μm, and is made of GaN which is doped with approximately $5\times10^{18}$ Si atoms/cm$^3$, and which has a carrier concentration of approximately $5\times10^{18}$ cm$^{-3}$.

In the fourth embodiment, as illustrated in FIG. 32, the step portions 171 are formed in the surface of the semiconductor laser device portion 150 by etching the n-type pad electrode 103, the n-type ohmic electrode 104 and the n-type contact layer 105, the surface facing the supporting substrate 101. With the step portions 171, gaps 170, in each of which no solder layer 102 exists, are formed respectively near the ends of the cavity surfaces 160 of the semiconductor laser device portion 150, the ends being closer to the supporting substrate 101.

An n-type cladding layer 106 is formed on the n-type contact layer 105. The n-type cladding layer 106 has a thickness of approximately 400 nm, and is made of $Al_{0.01}Ga_{0.99}N$ which is doped with approximately $5\times10^{18}$ Si atoms/cm$^3$, and which has a carrier concentration of approximately $5\times10^{18}$ cm$^{-3}$. A light emitting layer 107 is formed in an area of the n-type cladding layer 106 As illustrated in FIG. 34, the light emitting layer 107 includes an n-type carrier blocking layer 107e formed on the n-type cladding layer 106. The n-type carrier blocking layer 107e has a thickness of approximately 5 nm, and is made of $Al_{0.05}Ga_{0.95}N$ which is doped with approximately $5\times10^{18}$ Si atoms/cm$^3$, and which has a carrier concentration of approximately $5\times10^{18}$ cm$^{-3}$. A light guiding layer 107d is formed on the n-type carrier blocking layer 107e. The light guiding layer 107d has a thickness of approximately 100 nm, and is made of undoped In0.15Ga0.85N. An MQW active layer 107c is formed on the light guiding layer 107d. The MQW active layer 107c consists of four barrier layers 107a and three quantum-well layers 107b. Each of the barrier layers 107a has a thickness of approximately 20 nm, and is made of undoped In0.17Ga0.83N. Each of the quantum-well layers 107b has a thickness of approximately 3 nm, and is made of undoped In0.3Ga0.7N. The barrier layers 107a and the quantum-well layers 107b are alternately superposed. The light emitting layer 107 is configured of the MQW active layer 107c, the light guiding layer 107d and the n-type carrier blocking layer 107e.

A light guiding layer 108 is formed on the barrier layer 107a of the MQW active layer 107c constituting a part of the light emitting layer 107, as illustrated in FIGS. 33 and 34. The light guiding layer 108 has a thickness of approximately 100 nm, and is made of undoped In0.15Ga0.85N. A carrier blocking layer 109 is formed on the light guiding layer 108. The carrier blocking layer 109 has a thickness of approximately 20 nm, and is made of $Al_{0.05}Ga_{0.95}N$ which is doped with approximately $4\times10^{19}$ Mg atoms/cm$^3$, and which has a carrier concentration of approximately $5\times10^{17}$ cm$^{-3}$. A p-type cladding layer 110 having a projection portion is formed on the carrier blocking layer 109. The p-type cladding layer 110 is made of $Al_{0.01}Ga_{0.99}N$ which is doped with approximately $4\times10^{19}$ Mg atoms/cm$^3$, and which has a carrier concentration of approximately $5\times10^{17\ cm-3}$. The projection portion of the p-type cladding layer 110 has a thickness of approximately 400 nm, and the flat portion of the p-type cladding layer 110 other than the projection portion thereof has a thickness of approximately 80 nm. A p-type contact layer 111 is formed on the upper surface of the projection portion of the p-type cladding layer 110. The p-type contact layer 111 has a thickness of approximately 3000 nm, and is made of GaN which is doped with approximately $4\times10^{19}$ Mg atoms/cm$^3$, and which has a carrier concentration of approximately $5\times10^{17}$ cm$^{-3}$. The p-type contact layer 111 and the projection portion of the p-type cladding layer 110 constitute a ridge 112 serving as a current path. The ridge 112 has a width of approximately 1.5 μm and a height of approximately 380 nm. A p-type ohmic electrode 113 is formed on the p-type contact layer 111. The p-type ohmic electrode 113 consists of Pt, Pd and Au layers, which respectively have thicknesses of approximately 5 nm, approximately 100 nm and approximately 150 nm, and which are formed in order from the lower tier to the upper tier.

As illustrated in FIG. 83, an insulating film 114 of SiN, which has a thickness of approximately 250 nm, is formed on the upper surface of the n-type cladding layer 106 and the side surfaces of the light emitting layer 107, of the light guiding layer 108, of the carrier blocking layer 109, of the ridge 112 and of the p-type ohmic electrode 113. On the upper surfaces of the insulating layer 114 and the p-type ohmic electrode 113, a p-type pad electrode 115 having a width (W12) of approximately 125 μm is formed. The pad electrode 115 consists of Ti, Pd and Au layers, which respectively have thicknesses of approximately 100 nm, approximately 100 nm and approximately 3000 nm, and which are formed in order from the lower tier to the upper tier.

In the fourth embodiment, the semiconductor laser device portion 150 has the following configuration as described. The step portions 171 are formed respectively on the surface of the semiconductor laser device portion 150, the surfaces facing the supporting substrate 101. Because of the step portions 171, the gaps 170, in each of which no solder layer 102 exists, are formed respectively near the ends of the respective cavity surfaces 160 of the semiconductor laser device portion 150, the ends being closer to the supporting substrate 101. With this configuration, even when the solder layer 102 is formed on the entire surface of the supporting substrate 150 facing the supporting substrate 101, the gaps 170, in each of which no solder layer 102 exists, can be easily formed respectively near the ends of the cavity surfaces 160 of the semiconductor laser device portion 150, the ends being closer to the supporting substrate 101.

Incidentally, other effects of the fourth embodiment are similar to those of the first embodiment.

Figure 45:
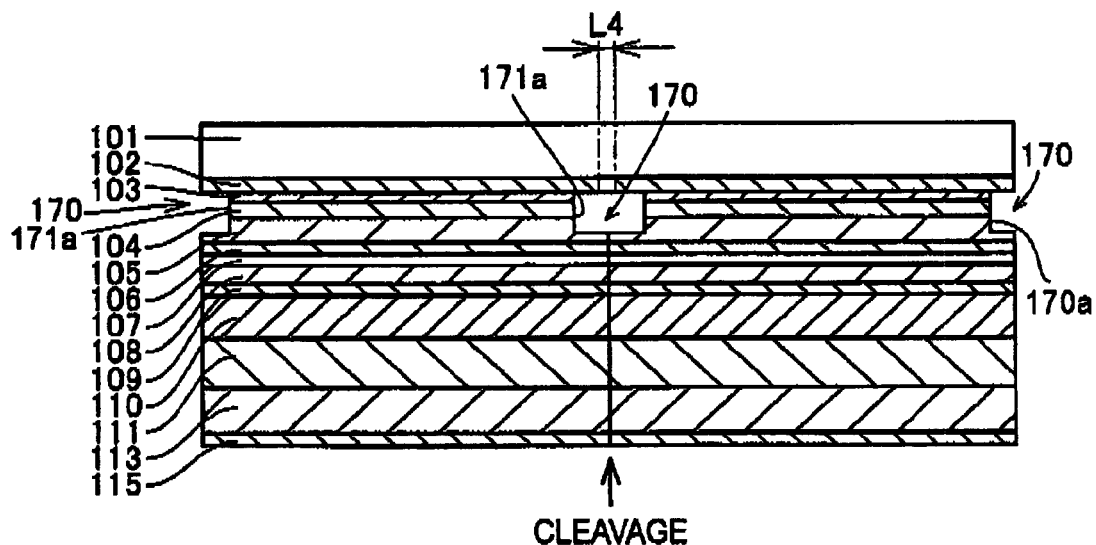
FIG. 45 is a cross-sectional view of the semiconductor laser device of the fourth embodiment illustrated in FIG. 31, taken along the line 5000-5000, for explaining the process of fabricating the semiconductor laser device.
Figure 46:
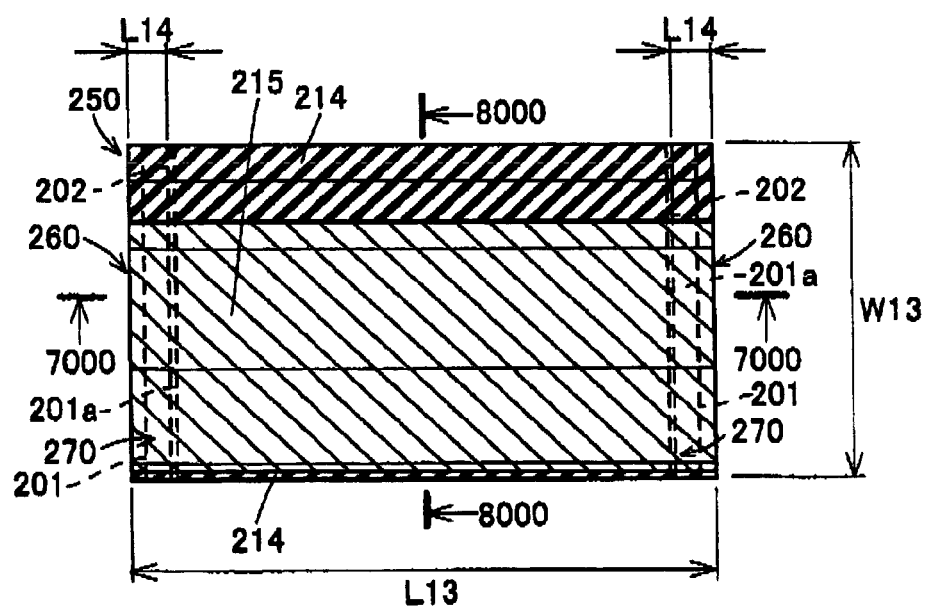
FIG. 46 is a plan view of a semiconductor laser device of a fifth embodiment of the present invention.

FIGS. 35 to 38 are cross-sectional views for explaining a process of fabricating the semiconductor laser device of the fourth embodiment illustrated in FIG. 46. By referring to FIGS. 31, 32 and 35 to 45, descriptions will be provided below for the process of fabricating the semiconductor laser device of the fourth embodiment. Note that FIGS. 34 to 37 and 40 to 44 respectively show cross-sections in the same direction as that of FIGS. 33, and FIGS. 38, 39 and 45 respectively show cross sections in the same direction as that of FIG. 32.

Figure 35:
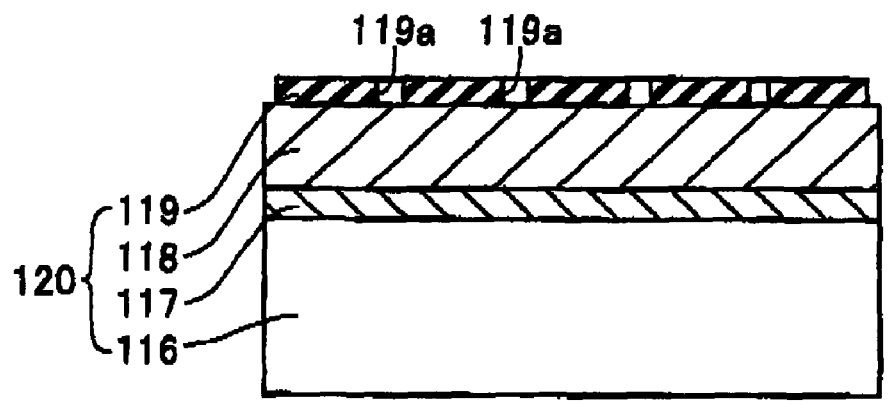
FIG. 35 is a cross-sectional view of the semiconductor laser device of the fourth embodiment illustrated in FIG. 31, taken along the line 6000-6600, for explaining a process of fabricating the semiconductor laser device.

First, as illustrated in FIG. 35, a buffer layer 117 and a GaN layer 118 are sequentially grown on a sapphire substrate 116 serving as a growth substrate by use of MOCVD as in the case of the first embodiment. Note that the sapphire substrate 116 is an example of the "growth substrate" of the present invention.

Specifically in a state where the sapphire substrate 116 is held at a growth temperature of approximately 600° C., the buffer layer 117 is grown on the (0001) plane of the sapphire substrate 116. The buffer layer 117 has a thickness of approximately 20 nm, and is made of GaN. Subsequently, in a state where the sapphire substrate 116 is held at a growth temperature of approximately 1050° C., the GaN layer 118 having a thickness of 2 μm is grown on the buffer layer 117. Thereafter, as illustrated in FIG. 35, a mask 119 formed of an SiO$_2$ film is formed on the GaN layer 118. The mask 119 is formed by forming a triangular lattice pattern with openings 119a each of which has a diameter of approximately 2 μm, and which are similar to those in the first embodiment illustrated in FIG. 10, with intervals of 10 μm as illustrated in FIG. 35. The triangular lattice pattern is formed by a lithography technique generally used. A selective growth base 120 is configured of the sapphire substrate 116, the buffer layer 117, the GaN layer 118, and the mask 119.

Figure 36:
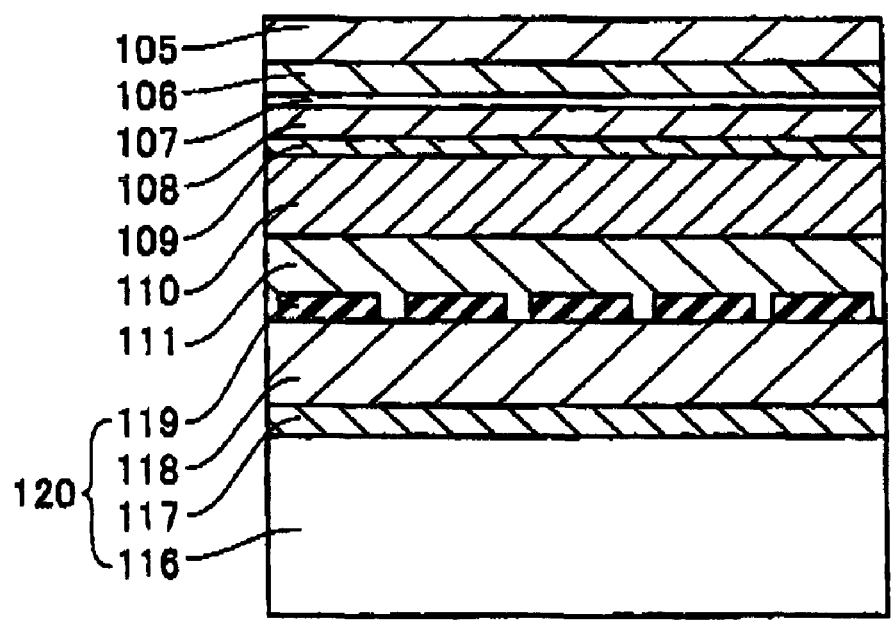
FIG. 36 is a cross-sectional view of the semiconductor laser device of the fourth embodiment illustrated in FIG. 31, taken along the line 6000-6000, for explaining the process of fabricating the semiconductor laser device.

As illustrated in FIG. 36, in a state where the sapphire substrate 116 is held at a growth temperature of approximately 1100° C., the p-type contact layer 111, the p-type cladding layer 110 having a thickness of approximately 400 nm, and the carrier blocking layer 109 are sequentially grown on the selective growth base 120 by MOCVD, the layers constituting a p-type nitride semiconductor layer. Subsequently, in a state where the sapphire substrate 116 is held at a growth temperature of approximately 800° C., the light guiding layer 108, the MQW active layer 107c and the light guiding layer 107d of the light emitting layer 107, are sequentially grown on the p-type nitride semiconductor layer. Thereafter, in a state where the sapphire substrate 116 is held at the growth temperature of approximately 800° C., the n-type carrier blocking layer 107e, the n-type cladding layer 106 and the n-type contact layer 105 are sequentially grown on the light guiding layer 107d, the layers constituting a n-type nitride semiconductor layer. Each of the layers from the GaN layer 118 to the n-type contact layer 105 has the surface, which faces the sapphire substrate 116, and which has N-polarity, and crystals of each of the above layers grow with Ga-polarity.

In the fourth embodiment, the p-type nitride semiconductor layer, which is made of GaN or AlGaN, is grown at a temperature higher than a temperature used for growing the MQW active layer. Thereafter, the MQW active layer 107c made of InGaN is grown, and then the n-type nitride semiconductor layer made of GaN or AlGaN is grown at a growth temperature substantially the same as that used for growing the MQW active layer 107c. In this event, the n-type nitride semiconductor layer is grown at the temperature substantially the same as that used for growing the MQW active layer 107c after the MQW active layer 107c of InGaN is grown. Thus, the possibility that the MQW active layer 107c is deteriorated in the step of growing the n-type nitride semiconductor layer is reduced even in a case where a composition ratio of In of the MQW active layer 107c is high. In addition, with the n-type nitride semiconductor layer, a high n-type carrier concentration is likely to be obtained even in a case where the crystallinity thereof is slightly lowered by reducing the temperature used for growing crystals. Meanwhile, the p-type nitride semiconductor layer can be grown at the generally-used growth temperature for GaN or AlGaN because the p-type nitride semiconductor layer is grown before the MQW active layer 107c is grown. Accordingly, it is made possible to form the p-type nitride semiconductor layer having excellent crystallinity, and to obtain a high p-type carrier concentration.

Figure 37:
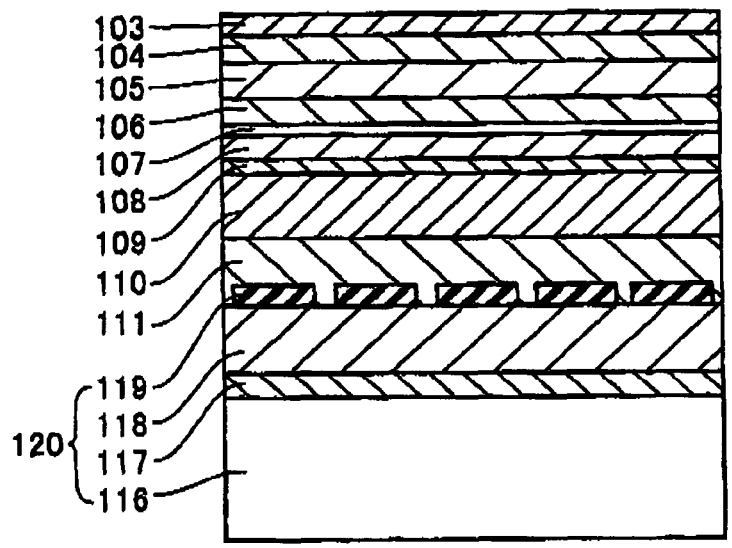
FIG. 37 is a cross-sectional view of the semiconductor laser device of the fourth embodiment illustrated in FIG. 31, taken along the line 6000-6000, for explaining the process of fabricating the semiconductor laser device.

Subsequently, as illustrated in FIG. 37, an n-type ohmic electrode 104 is formed on the n-type contact layer 105 by vacuum evaporation or the like, The n-type ohmic electrode 104 has a thickness of approximately 10 nm, and is made of Al. Thereafter, on the n-type ohmic electrode 104, an n-type pad electrode 103, which consists of Pt and Au layers, is formed. The Pt and Au layers respectively have thicknesses of approximately 20 nm and approximately 300 nm, and are formed in order from the lower tier to the upper tier.

Figure 38:
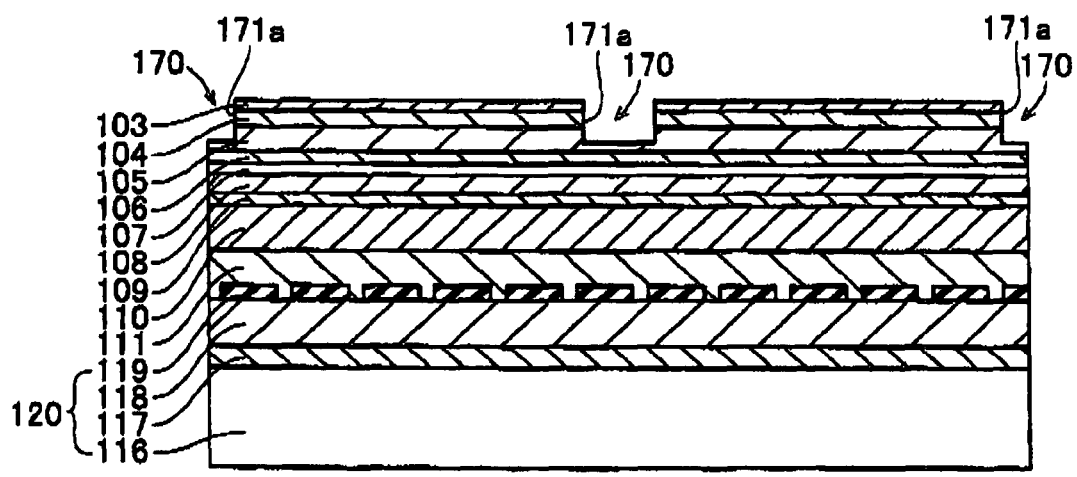
FIG. 38 is a cross-sectional view of the semiconductor laser device of the fourth embodiment illustrated in FIG. 31, taken along the line 5000-5000, for explaining the process of fabricating the semiconductor laser device.
Figure 39:
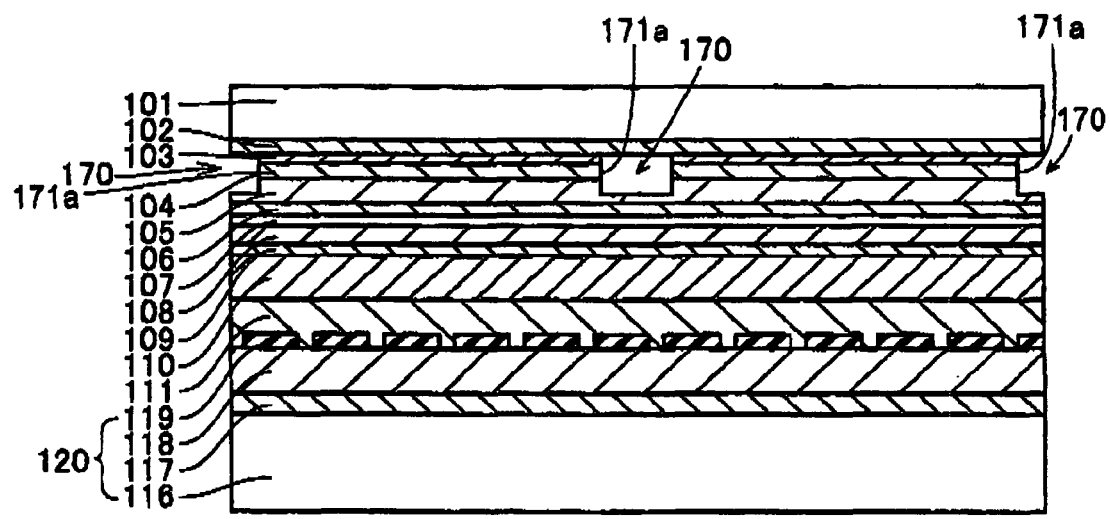
FIG. 39 is a cross-sectional view of the semiconductor laser device of the fourth embodiment illustrated in FIG. 31, taken along the line 5000-5000, for explaining the process of fabricating the semiconductor laser device.
Figure 40:
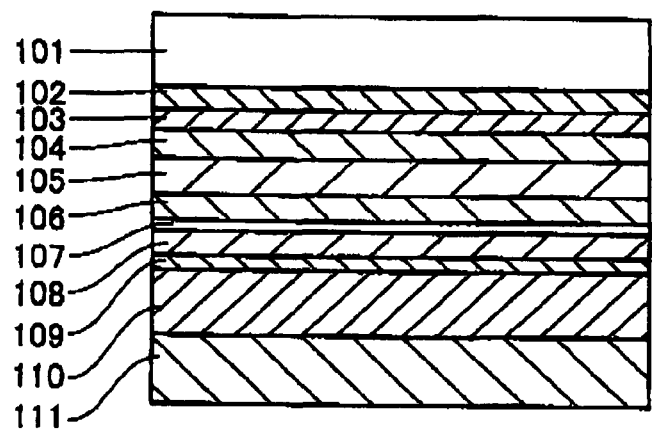
FIG. 40 is a cross-sectional view of the semiconductor laser device of the fourth embodiment illustrated in FIG. 31, taken along the line 6000-6000, for explaining the process of fabricating the semiconductor laser device.

After that, as illustrated in FIG. 38, recess portions 171a are formed by etching and removing the n-type pad electrode 103, the n-type ohmic electrode 104, and the areas of the n-type contact layer 105 from which the cavity surfaces 160 are formed by Use of photolithography and dry-etching techniques. Next, as illustrated in FIG. 39, the solder layer 102 is formed on the entire surface of the supporting substrate 101, which faces the semiconductor laser device portion 150, and is then attached to the surface of the n-type pad electrode 103 of the semiconductor laser device portion 150. Accordingly, the gaps 170 are formed respectively in the areas between the solder layer 102 corresponding to each of the recess portions 171a and the n-type pad electrode 103 of the semiconductor laser device portion 150. Thereafter, the selective growth base 120 is removed by use of the dry-etching technique to expose the entire surface of the p-type contact layer 111, the surface opposite to the surface facing the supporting substrate 101. Hence, the cross-sectional shape of the semiconductor laser device portion 150 illustrated in FIG. 40 is obtained. FIG. 40 shows a view where the semiconductor laser device portion 150 is viewed in the direction in which the semiconductor laser device portion 150 shown in FIG. 39 is turned in an 90-degree angle. Thereafter, the semiconductor laser device portion 150 is annealed in an N2 atmosphere in the state of being held at approximately 800° C., so that the acceptors of the p-type nitride semiconductor layer are activated. Thereby, a predetermined hole concentration is obtained.

Figure 41:
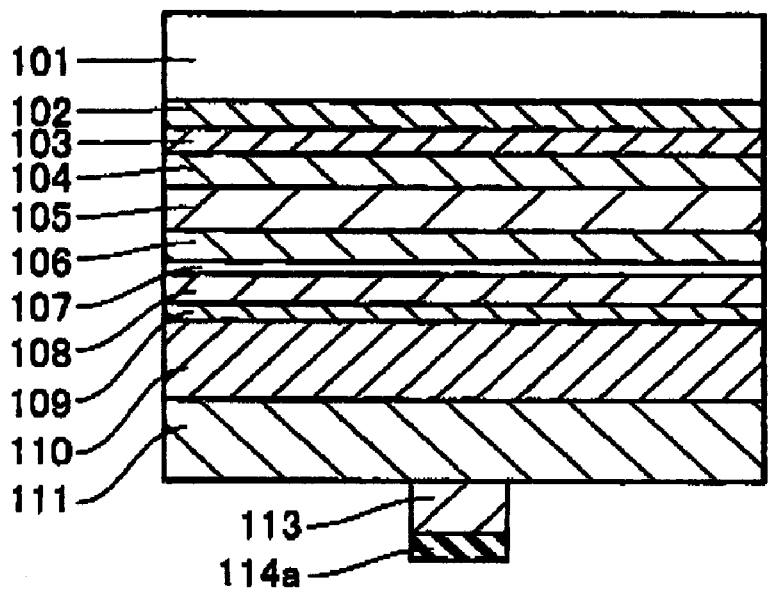
FIG. 41 is a cross-sectional view of the semiconductor laser device of the fourth embodiment illustrated in FIG. 31, taken along the line 6000-6000, for explaining the process of fabricating the semiconductor laser device.

Subsequently, by vacuum evaporation or the like, the p-type ohmic electrode 113 and the insulating film 114a of SiO$_2$, which has a thickness of approximately 0.25 μm, are sequentially formed on the surface of the p-type contact layer 111, and are then subjected to patterning. Accordingly, the p-type ohmic electrode 118 and the insulating film 114a having the shapes illustrated in FIG. 41 are obtained. The p-type ohmic electrode 113 is configured of the Pt, Pd and Au layers, which are superposed in order from the lower tier to the upper tier, and which respectively have thicknesses of approximately 5 nm, approximately 100 nm and approximately 150 nm. The semiconductor device layer including the p-type contact layer 111 is grown, with the (0001) Ga plane as the surface of the p-type contact layer 111, on the (0001) plane of the sapphire substrate 116 serving as a growth substrate. Thus, the p-type ohmic electrode 113 is formed on the (000-1) N surface of the p-type contact layer 111. A nitride surface such as the (000-1) N plane is more reactive than a Ga surface such as the (0001) Ga plane. For this reason, in the fourth embodiment in which the p-type ohmic electrode 113 is formed on the nitride surface of the p-type contact layer 111, the p-type ohmic electrode 113 and the p-type contact layer 111 are easily alloyed. Thereby, excellent ohmic characteristics are likely obtained.

Figure 42:
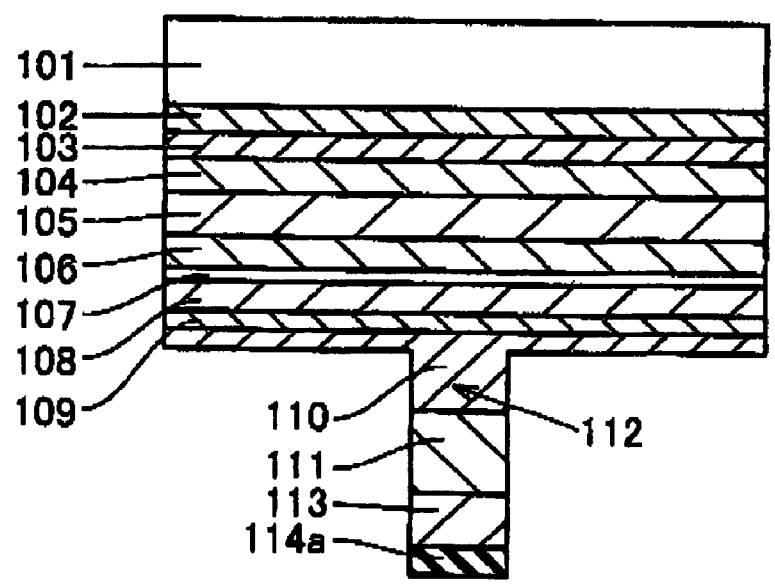
FIG. 42 is a cross-sectional view of the semiconductor laser device of the fourth embodiment illustrated in FIG. 31, taken along the line 6000-6000, for explaining the process of fabricating the semiconductor laser device.
Figure 43:
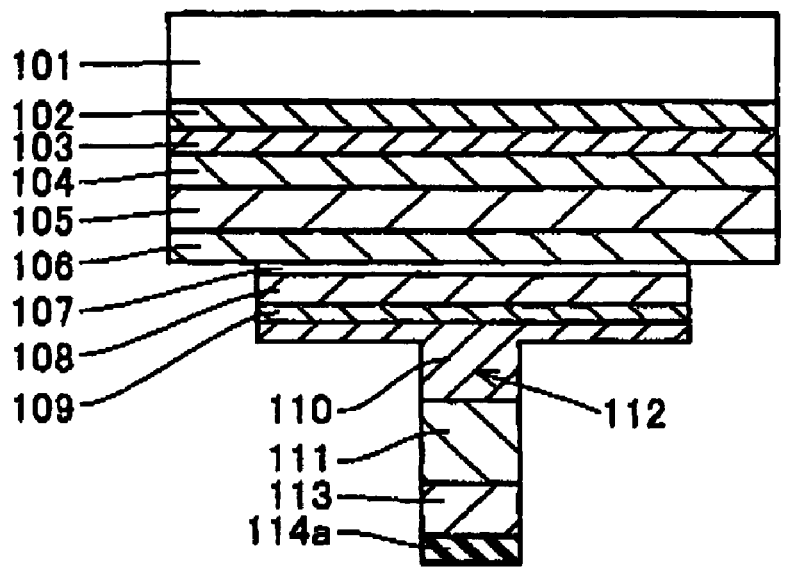
FIG. 43 is a cross-sectional view of the semiconductor laser device of the fourth embodiment illustrated in FIG. 31, taken along the line 6000-6600, for explaining the process of fabricating the semiconductor laser device.
Figure 44:
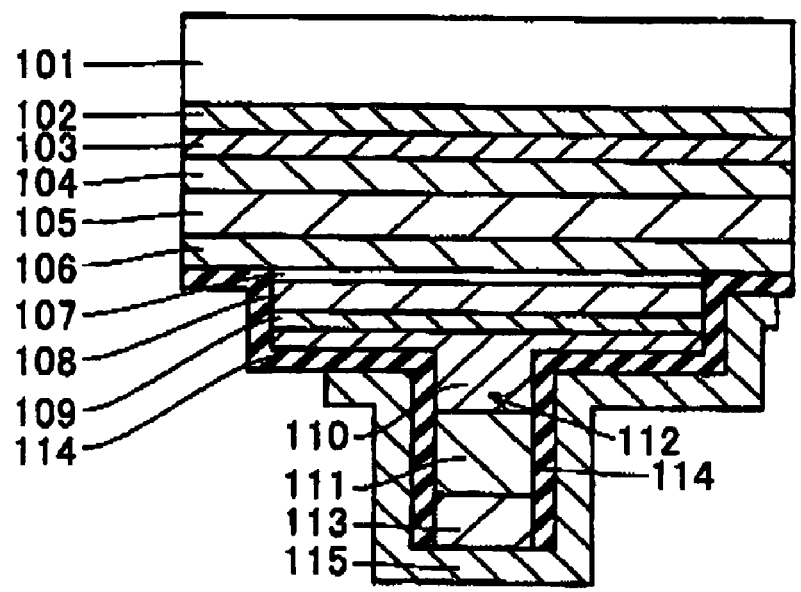
FIG. 44 is a cross-sectional view of the semiconductor laser device of the fourth embodiment illustrated in FIG. 31, taken along the line 6000-6000, for explaining the process of fabricating the semiconductor laser device.

As illustrated in FIG. 42, in a state where the semiconductor laser device portion 150 is held at approximately 200° C., portions of the p-type contact layer 111 and the p-type cladding layer 110 are removed by dry etching with a Cl$_2$ gas, using the insulating film 114a as a mask Accordingly, the ridge 112 is formed. The width and height of the ridge 112 are respectively approximately 1.5 μm and approximately 380 nm. Subsequently, as illustrated in FIG. 43, portions of the light emitting layer 107, of the light guiding layer 108, of the carrier blocking layer 109, and of the flat portion of the p-type cladding layer 110 are etched, and thus each of the light emitting layer 107, the light guiding layer 108, the carrier blocking layer 109 and the p-type cladding layer 110 is subjected to patterning so as to have a width of approximately 4.5 μm. In this event, the photolithography and dry-etching techniques are used. Thereafter, as illustrated in FIG. 44, the insulating film 114 of SiN, which has a thickness of approximately 250 nm, is formed so as to cover the upper surface of the n-type cladding layer 106, the side surfaces of the light emitting layer 107, the side surfaces of the light guiding layer 108, the side surfaces of the carrier blocking layer 109 and the side surfaces of the flat portion of the p-type cladding layer 110, the upper surface of the flat portion of the p-type cladding layer 110, the side surfaces of the ridge 112, and the upper surface of the insulating layer 114a. After that, only a portion of the insulating films 114 and 114a, which are on the surface of the p-type ohmic electrode 118, are removed. Thereafter, the p-type pad electrode 115 is formed on the surfaces of the p-type ohmic electrode 113 and the insulating film 114. The p-type pad electrode 115 consists of the Ti, Pd and Au layers, which respectively have thicknesses of approximately 100 nm, approximately 100 nm and approximately 3000 nm, and which are formed in order from the lower tier to the upper tier.

Then, as illustrated in FIG. 45, grooves for scribing (not illustrated) are provided to the surface of the semiconductor laser device portion 150 perpendicular to the main surface of the supporting substrate 101 in order to cleave the semiconductor laser device portion 150 along the (1-100) plane of the semiconductor laser device portion 150 by use of ultrasonic waves. Finally, the semiconductor laser device portions 150 are split by dicing only the supporting substrate 101 positioned above the recess portions 171a, so that portions thereof each having a width (L4) of approximately 40 μm is removed as in the case of the first embodiment. As described above, the semiconductor laser device having the step portions 171 of the fourth embodiment illustrated in FIGS. 31 and 32 is formed.

Fifth Embodiment

Figure 47:
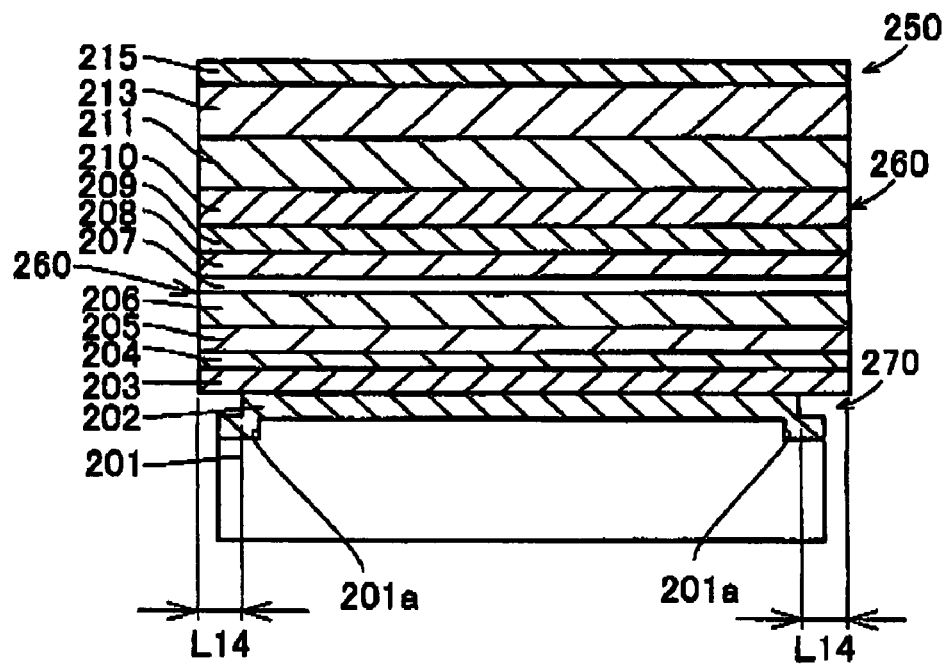
FIG. 47 is a cross-sectional view of the semiconductor laser device of the fifth embodiment illustrated in FIG. 46, taken along the line 7000-7000.
Figure 49:
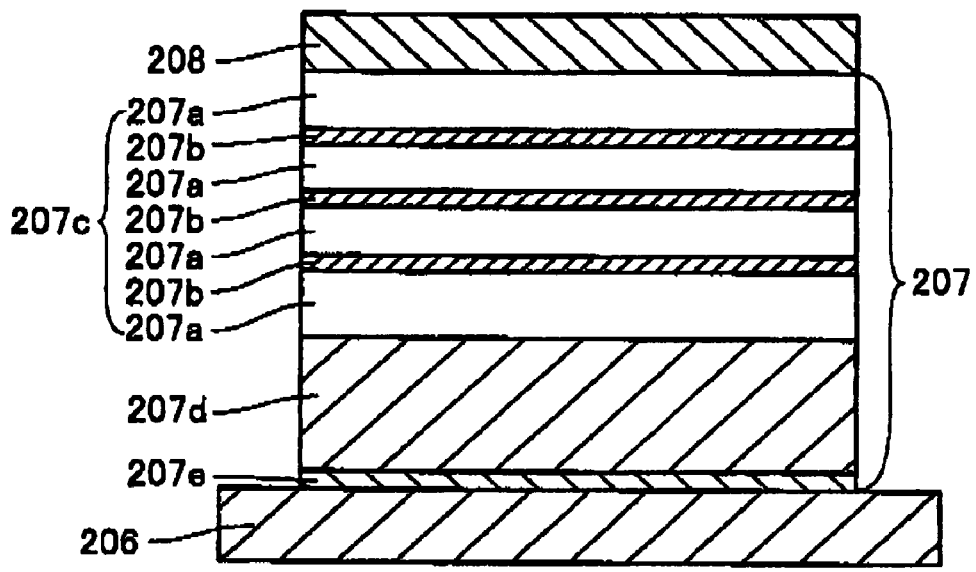
FIG. 49 is a cross-sectional view of a structure of a light emitting layer of the semiconductor laser device of the fifth embodiment illustrated in FIG. 46.
Figure 50:
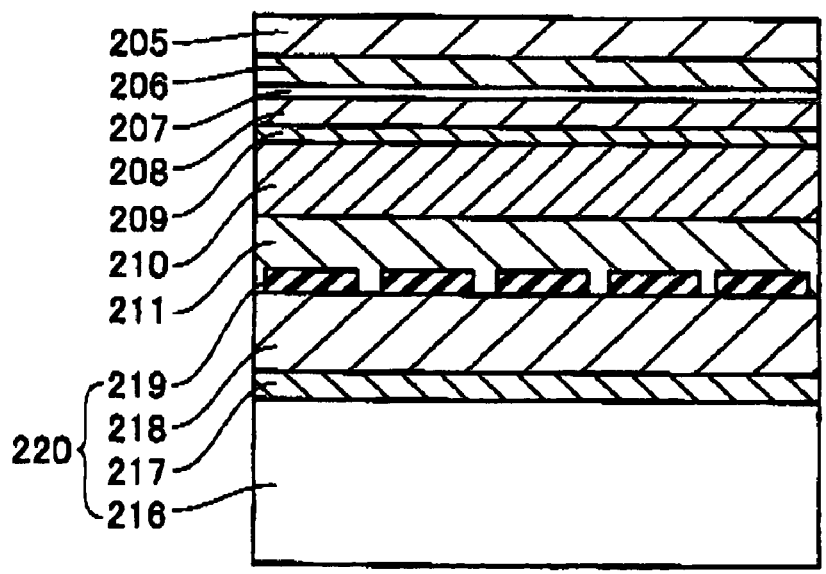
FIG. 50 is a cross-sectional view of the semiconductor laser device of the fifth embodiment illustrated in FIG. 46, taken along the line 8000-8000, for explaining a process of fabricating the semiconductor laser device.

FIG. 46 is a plan view of a semiconductor laser device of a fifth embodiment of the present invention. FIG. 47 is a cross-sectional view of the semiconductor laser device of the fifth embodiment illustrated in FIG. 46, taken along the line 7000-7000. FIG. 50 is a cross-sectional view of the semiconductor laser device of the fifth embodiment illustrated in FIG. 46, taken along the line 8000-8000. FIG. 49 is a cross-sectional view of a structure of a light emitting layer of the semiconductor laser device of the fifth embodiment illustrated in FIG. 46. By referring to FIGS. 46 to 49, descriptions will be provided for the structure of the semiconductor laser device of the fifth embodiment. In the structure, unlike the case of the fourth embodiment described above, step portions 201a are provided to the surface of a supporting substrate 201, the surface facing a semiconductor laser device portion 250. Each of the step portions 201a is an example of a "second step portion" of the present invention.

In the semiconductor laser device of the fifth embodiment, as illustrated in FIGS. 46 and 47, the supporting substrate 201 and the semiconductor laser device portion 250 are adhered to each other with a solder layer 202 interposed in between. The solder layer 202 is an example of the "solder layer" of the present invention. As illustrated in FIGS. 46 and 47, a pair of cavity surfaces 260, which cleavage planes constitute, are formed in the semiconductor laser device portion 250. As illustrated in FIG. 46, the semiconductor laser device has a length L13 of approximately 600 μm and a width W13 of approximately 400 μm.

In the fifth embodiment, as illustrated in FIG. 47, step portions 201a are provided in the surface of the supporting substrate 201, the surface facing the semiconductor laser device portion 250. Accordingly, the step portions are also formed in the portions of the solder layer 202 of the supporting substrate 201, the portions being closer to the semiconductor laser device portion 260. Since the supporting substrate 201 and the semiconductor laser device portion 250 are adhered to each other with the solder layer 202 interposed in between, gaps 270, in each of which no solder layer 202 exists, are formed respectively near the ends of the respective cavity surfaces 260 of the semiconductor laser device portion 250, the ends being closer to the supporting substrate 201. As illustrated in FIGS. 46 and 47, the gaps 270 where no solder layer 202 exists are formed so that the gaps 270 occupy the space extending inward for approximately 25 μm (L14) from the lines extending respectively the cavity surfaces 260.

In the semiconductor laser device of the fifth embodiment, as illustrated in FIG. 50, the electric conductive solder layer 202 is formed on the electric conductive supporting substrate 201. The solder layer 202 has a thickness of approximately 5 μm, and is made of AuSn. The supporting substrate 201 has a thickness of approximately 300 μm, and is made of Cu—W having no cleavability. A p-type pad electrode 203 is formed on the semiconductor layer 202. The p-type pad electrode 203 consists of Au, Pt and Ti layers which respectively have thicknesses of approximately 3000 nm, approximately 100 nm, and approximately 100 nm, and which are formed in order from the lower tier to the upper tier. A p-type ohmic electrode 204 is formed on the p-type pad electrode 203. The p-type ohmic electrode 204 consists of Au, Pd and Pt layers which respectively have thicknesses of approximately 150 nm, approximately 100 nm, and approximately 5 nm, and which are formed in order from the lower tier to the upper tier. A p-type contact layer 205 is formed on the p-type ohmic electrode 204. The p-type contact layer 205 has a thickness of approximately 10 nm, and is made of In0.02Ga0.98N which is doped with approximately $4 \times 10^{19}$ Mg atoms/cm$^3$, and which has a carrier concentration of approximately $5 \times 10^{17}$ cm$^{-3}$.

A p-type cladding layer 206 is formed on the n-type contact layer 205. The p-type cladding layer 206 has a thickness of approximately 400 nm, and is made of $Al_{0.07}Ga_{0.93}N$ which is doped with approximately $4 \times 10^{19}$ Mg atoms/cm$^3$, and which has a carrier concentration of approximately $5 \times 10^{17}$ cm$^{-3}$. A light emitting layer 207 is formed on an area of the p-type cladding layer 206. As illustrated in FIG. 49, the light emitting layer 207 includes a cap layer 207e formed on the p-type cladding layer 206. The cap layer 207e has a thickness of approximately 20 nm, and is made of $Al_{0.16}Ga_{0.84}N$ which is doped with approximately $4 \times 10^{19}$ Mg atoms/m$^3$. A light guiding layer 207d is formed On the cap layer 207e. The light guiding layer 207d has a thickness of approximately 100 nm, and is made of GaN doped with approximately $4 \times 10^{19}$ Mg atoms/cm$^3$. An MQW active layer 207c is formed on the light guiding layer 207d. The MQW active layer 207c consists of four barrier layers 207a and three quantum-well layers 207b which are alternately superposed. Each of the barrier layers 207a has a thickness of approximately 20 nm, and is made of undoped In0.02Ga0.98N. Each of the quantum-well layers 207b has a thickness of approximately 3 nm, and is made of undoped In0.15Ga0.85N. The light emitting layer 207 is configured of the MQW active layer 207c, the light guiding layer 207d and the cap layer 207e.

A light guiding layer 208 is formed on the barrier layer 207a of the MQW active layer 207c constituting a part of the light emitting layer 207, as illustrated in FIGS. 49 and 50. The light guiding layer 208 has a thickness of approximately 100 nm, and is made of GaN which is doped with approximately $5 \times 10^{18}$ Si atoms/cm$^3$, and which has a carrier concentration of approximately $5 \times 10^{18}$ cm$^{-3}$. An n-type carrier blocking layer 209 is formed on the light guiding layer 208. The n-type carrier blocking layer 209 has a thickness of approximately 5 nm, and is made of $Al_{0.16}Ga_{0.84}N$ which is doped with approximately $5 \times 10^{18}$ Si atoms/cm$^3$, and which has a carrier concentration of approximately $5 \times 10^{18}$ cm$^{-3}$. On the n-type carrier blocking layer 209, an n-type cladding layer 210 having a projection portion is formed. The n-type cladding layer 210 is made of $Al_{0.07}Ga_{0.93}N$ which is doped with approximately $5 \times 10^{18}$ Si atoms/cm$^3$, and which has a carrier concentration of approximately $5 \times 10^{18}$ cm$^{-3}$. The projection portion of the p-type cladding layer 210 has a thickness of approximately 400 nm, and the flat portion of the n-type cladding layer 210 other than the projection portion thereof has a thickness of approximately 80 nm. An n-type contact layer 211 is formed on the upper surface of the projection portion of the n-type cladding layer 210. The n-type contact layer 211 has a thickness of approximately 5 μm, and is made of GaN which is doped with approximately $5 \times 10^{18}$ Si atoms/cm$^3$, and which has a carrier concentration of approximately $5 \times 10^{18}$ cm$^{-3}$. The n-type contact layer 211 and the projection portion of the n-type cladding layer 210 constitute a ridge 212 serving as a current path. The ridge 212 has a width of approximately 1.5 μm and a height of approximately 380 nm. An n-type ohmic electrode 213 which has a thickness of approximately 10 nm, and which is made of Al, is formed on the n-type contact layer 211.

Figure 48:
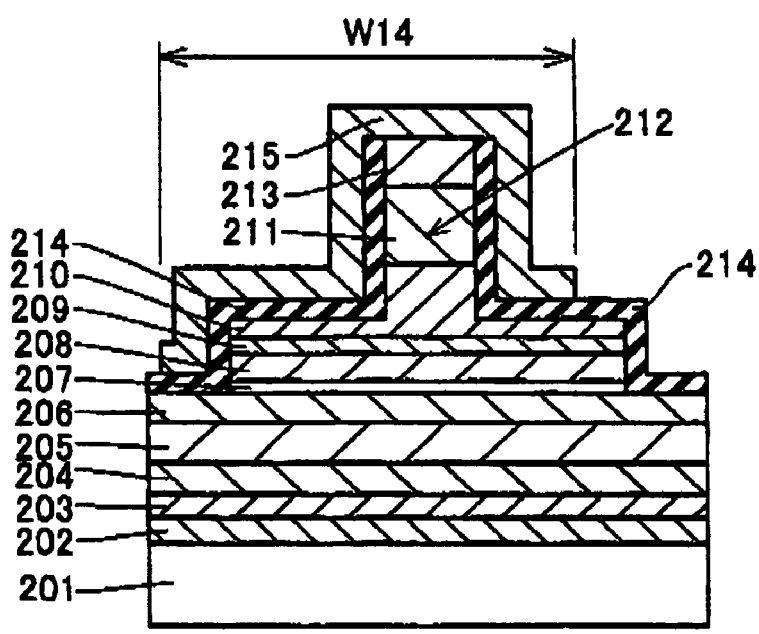
FIG. 48 is a cross-sectional view of the semiconductor laser device of the fifth embodiment illustrated in FIG. 46 taken along the line 8000-8000.

As illustrated in FIG. 48, an insulating film 214 of SiN, which has a thickness of approximately 250 nm, is formed on the upper surface of the n-type cladding layer 206 and the side surfaces of the light emitting layer 207, of the light guiding layer 208, of the n-type carrier blocking layer 209, of the ridge 212 and of the n-type ohmic electrode 213. An n-type pad electrode 215 having a width (W14) of approximately 125 μm is formed on the upper surfaces of the insulating layer 214 and the p-type ohmic electrode 213. The pad electrode 216 consists of Pt and Au layers, which respectively have thicknesses of approximately 20 nm and approximately 300 nm, and which are formed in order from the lower tier to the upper tier.

As described, the semiconductor laser device of the fifth embodiment has the following configuration. The step portions 201a are provided respectively in the surface of the supporting substrate 201, the surfaces facing the semiconductor laser device portion 250. With the step portions 201a, the gaps 270, in each of which no solder layer 202 exists, are formed respectively near the ends of the cavity surfaces 260 of the semiconductor laser device portion 250, the ends being closer to the supporting substrate 201. With the step portions 201a provided in the surface of the of the supporting substrate 201 facing the semiconductor laser device portion 250, even when the solder layer 202 is formed on the entire surface of the supporting substrate 201 facing the semiconductor laser device portion 250, the gaps 270, in each of which no solder layer 202 exists, can be easily formed respectively near the ends of the cavity surfaces 260 of the semiconductor laser device portion 250, the ends being closer to the supporting substrate 201.

Incidentally, other effects of the fifth embodiment are similar to those of the first embodiment and of the fourth embodiment.

FIGS. 50 to 58 are cross-sectional views for explaining a process of fabricating the semiconductor laser device of the fifth embodiment illustrated in FIG. 46. By referring to FIGS. 46, 47 and 50 to 58, descriptions will be provided for the process of fabricating the semiconductor laser device of the fifth embodiment. Note that FIGS. 50, 51 and 53 to 57 respectively show cross-sections of the semiconductor laser device in the same direction as that of FIG. 48, and FIGS. 52 and 58 respectively show cross sections of the semiconductor laser device in the same direction as that of FIG. 47.

First, as illustrated in FIG. 50, each of layers from a buffer layer 217 to the p-type contact layer 205 are formed on a sapphire substrate 216 by the same steps as that of the first embodiment of FIGS. 9 to 11. Thereafter, in a state where the sapphire substrate 216 is held at approximately 800° C., the sapphire substrate 216 is annealed to activate the acceptors of the p-type nitride semiconductor layer. Thereby, a predetermined hole concentration is obtained.

Figure 51:
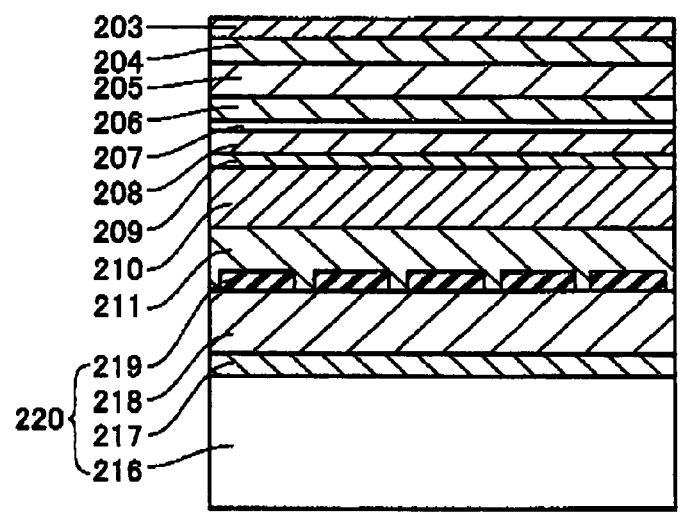
FIG. 51 is a cross-sectional view of the semiconductor laser device of the fifth embodiment illustrated in FIG. 46, taken along the line 8000-8000, for explaining the process of fabricating the semiconductor laser device.

As illustrated in FIG. 51, the p-type ohmic electrode 204 is formed on the p-type contact layer 205 by vacuum evaporation or the like. The p-type ohmic electrode 204 consists of the Pt, Pd and Au layers which respectively have thicknesses of approximately 5 nm, approximately 100 nm and approximately 150 nm, and which are formed in order from the lower tier to the upper tier. Thereafter, the p-type pad electrode 203 is formed on the p-type ohmic electrode 204. The p-type pad electrode 203 consists of the Ti, Pd and Au layers, which respectively have thicknesses of approximately 100 nm, approximately 100 nm and approximately 3000 nm, and which are formed in order from the lower tier to the upper tier.

Figure 52:
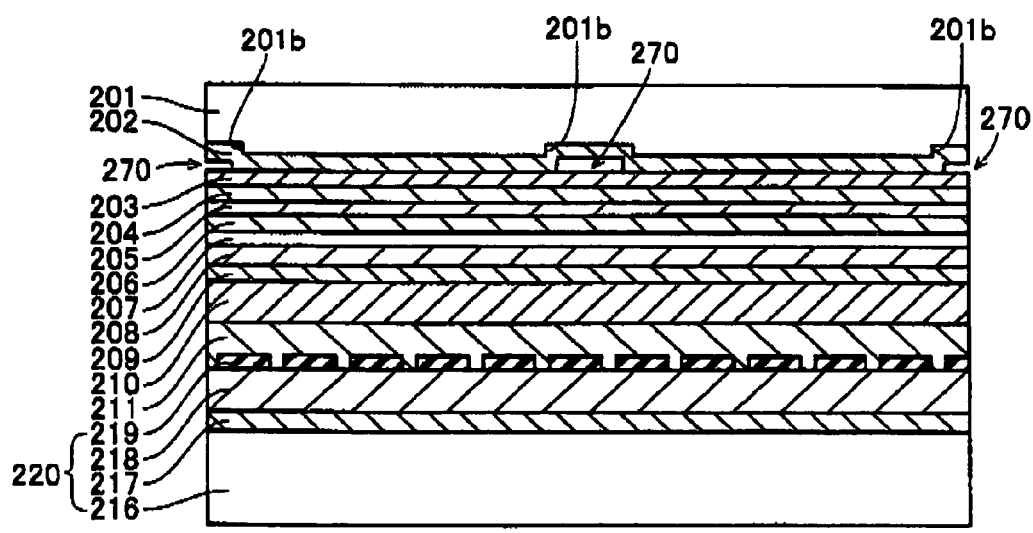
FIG. 52 is a cross-sectional view of the semiconductor laser device of the fifth embodiment illustrated in FIG. 46, taken along the line 7000-7000, for explaining the process of fabricating the semiconductor laser device.
Figure 53:
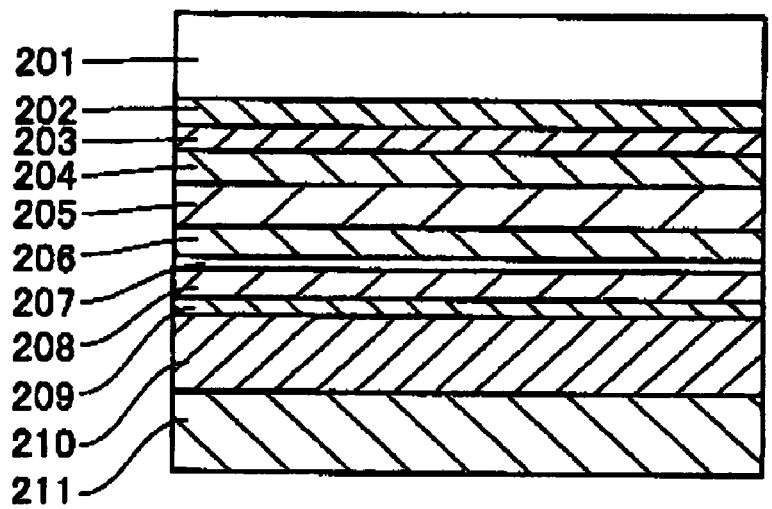
FIG. 53 is a cross-sectional view of the semiconductor laser device of the fifth embodiment illustrated in FIG. 46, taken along the line 8000-8000, for explaining the process of fabricating the semiconductor laser device.
Figure 54:
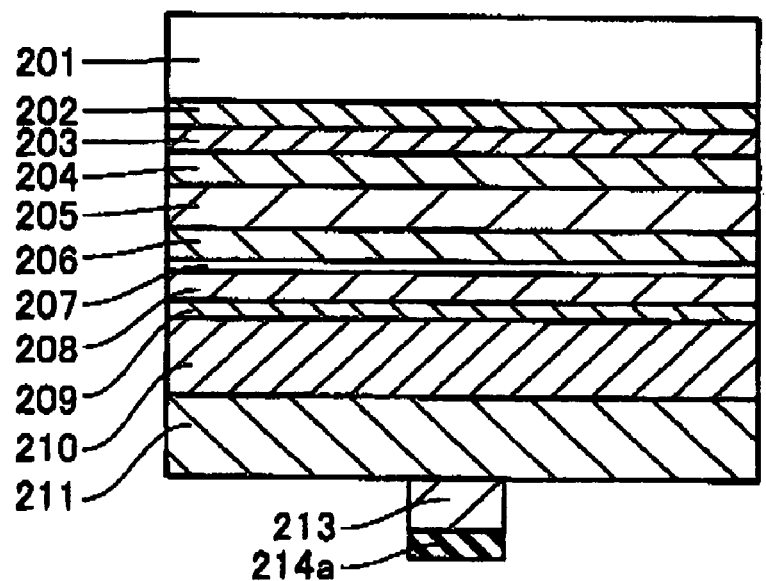
FIG. 54 is a cross-sectional view of the semiconductor laser device of the fifth embodiment illustrated in FIG. 46, taken along the line 8000-8000, for explaining the process of fabricating the semiconductor laser device.

Subsequently, the solder layer 202 of AuSn, which has a thickness of approximately 5 μm, is formed on the entire surface of the supporting substrate 201, the surface facing the semiconductor laser device portion 250. The supporting substrate 201 includes recess portions 201b in the surface of the supporting substrate 201 facing the semiconductor laser device portion 250. As illustrated in FIG. 52, the supporting substrate 201 and the p-type pad electrode 203 of the semiconductor laser device portion 250 are then caused to attach to each other with the solder layer 202 interposed in between. Hence, the gaps 270 are formed respectively in the areas between the solder layer 202 corresponding to each of the projection portions 201b and the p-type pad electrode 203 of the semiconductor laser device portion 250. Thereafter, the selective growth base 220 is removed by use of a dry-etching technique to expose the entire surface of the n-type contact layer 211, the surface being opposite to the surface facing the supporting substrate 201. The cross-sectional shape of the semiconductor laser device portion 250 illustrated in FIG. 53 is thus obtained. FIG. 53 shows a view where the semiconductor laser device portion 250 is viewed in the direction in which the semiconductor laser device portion 250 shown in FIG. 52 is turned in an 90-degree angle.

Figure 58:
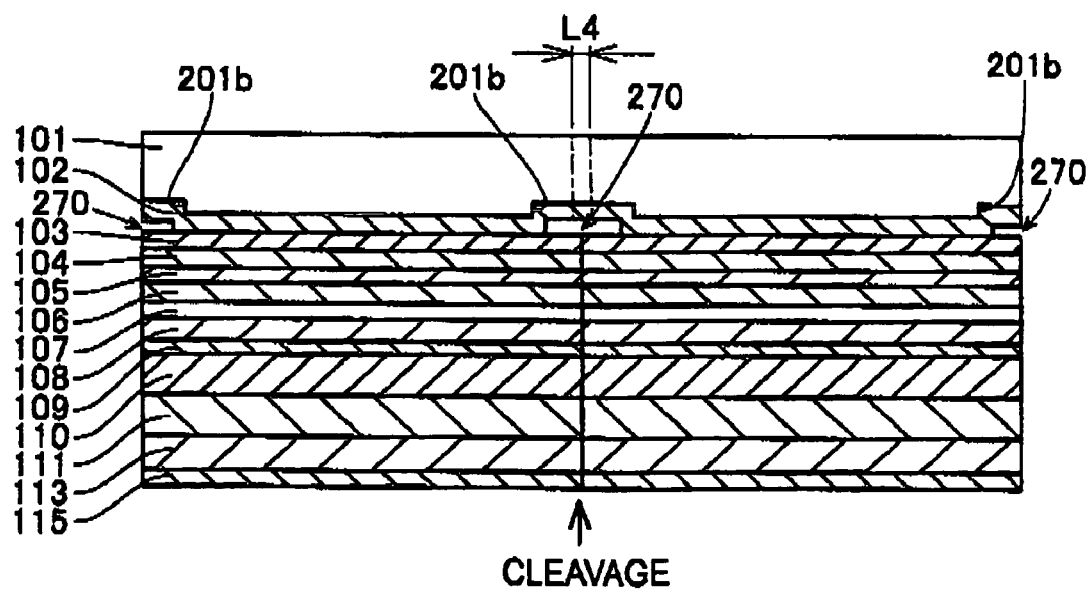
FIG. 58 is a cross-sectional view of the semiconductor laser device of the fifth embodiment illustrated in FIG. 46, taken along the line 7000-7000, for explaining the process of fabricating the semiconductor laser device.

Subsequently, by vacuum evaporation or the like, the n-type ohmic electrode 213 and the insulating film 214a of SiO$_2$, which has a thickness of approximately 0.25 μm, are sequentially formed on the surface of the n-type contact layer 211, and are then subjected to patterning. Accordingly, the n-type ohmic electrode 213 and the insulating film 214a, which have the shapes illustrated in FIG. 58, are obtained. The n-type ohmic electrode 213 has a thickness of approximately 10 nm, and is made of Al.

Figure 55:
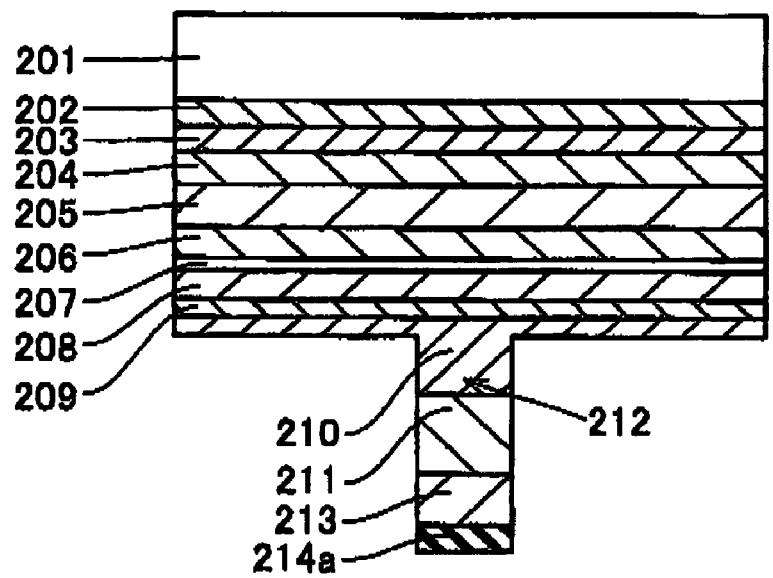
FIG. 55 is a cross-sectional view of the semiconductor laser device of the fifth embodiment illustrated in FIG. 46, taken along the line 8000-8000, for explaining the process of fabricating the semiconductor laser device.
Figure 56:
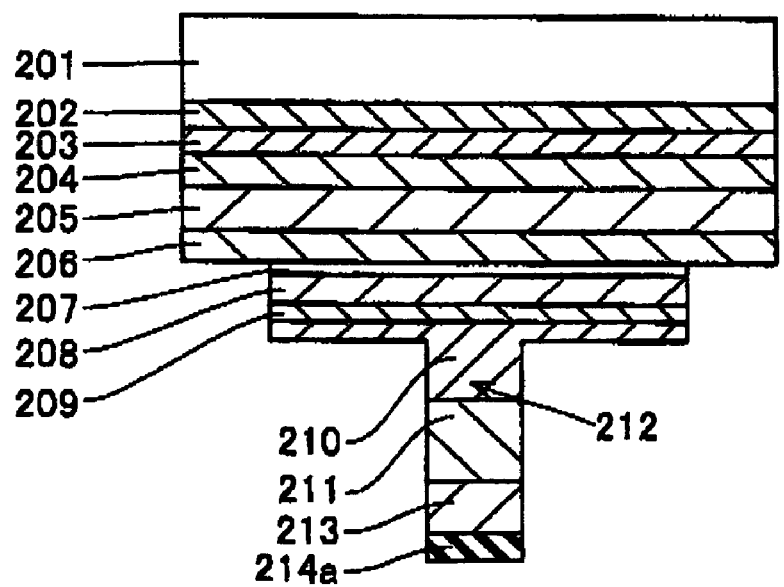
FIG. 56 is a cross-sectional view of the semiconductor laser device of the fifth embodiment illustrated in FIG. 46, taken along the line 8000-8000, for explaining the process of fabricating the semiconductor laser device.
Figure 57:
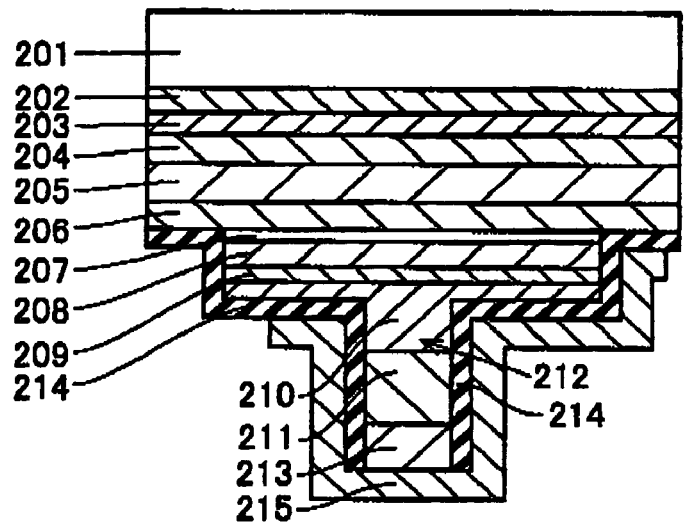
FIG. 57 is a cross-sectional view of the semiconductor laser device of the fifth embodiment illustrated in FIG. 46, taken along the line 8000-8000, for explaining the process of fabricating the semiconductor laser device.

Then, the ridge 212 is formed as illustrated in FIG. 55 by removing portions of the n-type contact layer 211 and of the n-type cladding layer 210 by dry etching with a Cl$_2$ gas, using the insulating film 214a as a mask. The width and height of the ridge 212 are respectively approximately 1.5 μm and approximately 380 nm. As illustrated in FIG. 56, portions of the light emitting layer 207, of the light guiding layer 208, of the n-type carrier blocking layer 209 and of the flat portion of the n-type cladding layer 210 are etched, and thus each of the light emitting layer 207, the light guiding layer 208, the carrier blocking layer 209 and the n-type cladding layer 210 is subjected to patterning to have a width of 4.5 μm, by means of photolithography and dry-etching techniques. Thereafter, as illustrated in FIG. 57, the insulating film 214 of SiN, which has a thickness of approximately 250 nm, is formed so as to cover the upper surface of the p-type cladding layer 206, the side surfaces of the light emitting layer 207, the side surfaces of the light guiding layer 208, the side surfaces of the n-type carrier blocking layer 209 and side surfaces of the flat portion of the n-type cladding layer 210, the upper surface of the flat portion of the n-type cladding layer 210, the side surfaces of the ridge 212, and the upper surface of the insulating film 214a. Only a portion of the insulating films 214 and 214a, which are on the surface of the n-type ohmic electrode 213, are then removed. Thereafter, the n-type pad electrode is formed on the surfaces of the n-type ohmic electrode 213 and the insulating film 214. The n-type pad electrode consists of the Pt and Au layers which respectively have the thicknesses of approximately 20 nm and approximately 300 nm, and which are formed in order from the lower tier to the upper tier.

As illustrated in FIG. 58, grooves for scribing (not illustrated) are provided to the surface of the semiconductor laser device portion 250, which is perpendicular to the main surface of the supporting substrate 201, in order to cleave the semiconductor laser device portion 250 along the (1-100) plane thereof by use of ultrasonic waves. Finally, the semiconductor laser device portions 250 is split by dicing only the supporting substrate 201 positioned above the recess portion 201b, so that portions thereof each having a width (L4) of approximately 40 μm is removed as in the case of the first embodiment. Accordingly, the semiconductor laser device having the step portions 201a of the fifth embodiment, which is illustrated in FIGS. 46 and 47, is formed.

The embodiments disclosed in the description are to be considered as examples in all aspects, and are not to be considered as limited. The scope of the present invention is shown not by the descriptions for the embodiments given above but by the scope of claims, and includes all changes in meanings and a scope which are equivalent to those of claims.

For instance, the examples, in each of which the present invention is applied to the device made of the nitride semiconductor, are shown in the first to fifth embodiments. Meanwhile, the present invention is not limited to this. The present invention may be applied to a device made of an oxide semiconductor such as ZnO. In addition, a crystal structure of a semiconductor may be the wurtzite structure or the zinc-blende structure. Furthermore, a plane orientation, with which crystals are grown, is not limited to [0001], and may be [11-20] or [1-100].

The examples, in each of which the solder layer of AuSn is used as an adhesive layer, are shown in the first to fifth embodiments. However, the present invention is not limited to this. A solder layer made of a material other than AuSn may be used as an adhesive layer. For instance, solder of InSn, SnAgCu, AnAgBi, SnAgCuBi, SnAgBiIn, SnZn, SnCu, SnBi, SnZnBi or the like may be used as an adhesive layer. Alternatively, a material, such as electric conductive paste, may be used as an adhesive layer.

The examples, in each of which the electric conductive substrate of Cu—W having no cleavability is used as a supporting substrate, are shown in the first to fifth embodiments. However, the present invention is not limited to this. A electric conductive substrate having cleavability may be used. For example, a semiconductor substrate made of Si, SiC, GaAs, ZnO or the like may be used. Alternatively, a metal plate of Al or Fe—Ni, a electric conductive resin film in which electric conductive fine particles of metal or the like, or a compound composed of metal and metal oxide may be used.

The examples, in each of which the active layer having the MQW structure is used, are shown in the first to fifth embodiments. However, the present invention is not limited to this. A single and thick layer having no quantum efficiency or a single quantum well structure may be used as the active layer.

The examples, in each of which the selective growth base is removed by use of the dry-etching technique, are shown in the first to fifth embodiments. However, the present invention is not limited to this. The selective growth base may be removed by use of a method other than the dry-etching technique, such as LLO.

The examples, in each of which the solder layer is subjected to patterning, and is formed on the surface of the supporting substrate, are shown in the first to third embodiments. However, the present invention is not limited to this. The solder layer may be formed on the surface of the supporting substrate by use of a method other than patterning.

The fourth embodiment shows the example, in which, after the crystals of the MQW active layer made of InGaN is grown, the crystals of the n-type nitride semiconductor layer are grown at a temperature approximately equal to that used for growing the crystals of the MQW active layer. However, the present invention is not limited to this. The crystals of the n-type nitride semiconductor layer may be grown at a temperature lower than that used for growing the crystals of the MQW active layer.

What is claimed is:

1. A semiconductor laser device comprising:
   a supporting substrate;
   a semiconductor laser device portion which is formed on a surface of the supporting substrate, and which includes a pair of cavity surfaces, said cavity surfaces being perpendicular to a direction in which a cavity of said semiconductor laser device portion extends; and
   an adhesive layer with which the supporting substrate and the semiconductor laser device portion are adhered to each other;
   wherein an ohmic electrode and a pad electrode are respectively formed on a surface of the semiconductor laser device portion facing the supporting substrate,
   wherein the adhesive layer is provided between the pad electrode and the supporting substrate,
   wherein an end of the adhesive layer at the cavity surfaces side of the semiconductor laser device portion is placed inwardly of an end of the pad electrode and an end of the supporting substrate at said cavity surfaces side, and
   wherein the semiconductor laser device further comprises at least one area between the supporting substrate and the pad electrode in which no adhesive layer exists, said area being near the end of the pad electrode and the end of the supporting substrate at the cavity surfaces side.

2. The semiconductor laser device according to claim 1, wherein the supporting substrate has no cleavability on surfaces parallel to the cavity surfaces.

3. The semiconductor laser device according to claim 1, wherein the supporting substrate and the adhesive layer are electrically conductive.

4. The semiconductor laser device according to claim 1, wherein the adhesive layer is formed with a predetermined space between the adhesive layer and each of the cavity surfaces.

5. The semiconductor laser device according to claim 1, wherein each of the cavity surfaces is a cleavage plane.

6. The semiconductor laser device according to claim 1, wherein the semiconductor laser device portion is formed of nitride semiconductor layers.

7. The semiconductor laser device according to claim 1, wherein gaps are included between the semiconductor laser device portion and the supporting substrate, the gaps being on lines extending respectively from the cavity surfaces.

8. The semiconductor laser device according to claim 1, wherein each of the cavity surfaces jut out of the respective side surfaces of the semiconductor laser device portion in a direction perpendicular to the cavity surfaces.

9. A semiconductor laser device according to claim 1, wherein said at least one area comprises a plurality of areas.

10. A semiconductor laser device according to claim 7, wherein said gap is formed such that it extends in the entire cavity surfaces direction.

11. The semiconductor laser device according to claim 1, wherein each of the cavity surfaces jut out of the end of the supporting substrate in a direction perpendicular to the cavity surfaces.

12. The semiconductor laser device according to claim 1, wherein the semiconductor laser device portion has a ridge which extends in said direction, and said cavity surfaces are formed on side surfaces of said ridge.

13. The semiconductor laser device according to claim 1, wherein the semiconductor laser device portion has a current path which extends in said direction.

14. The semiconductor laser device according to claim 1, wherein said cavity surfaces are a (1-100) plane.

15. The semiconductor laser device according to claim 1, wherein said adhesive layer has a first end at a cavity surface side of said semiconductor laser device portion in a direction perpendicular to the cavity surface, said pad electrode has a second end at a cavity surface side of said semiconductor laser device portion in a direction perpendicular to the cavity surface, and said supporting substrate has a third end at a cavity surface side of said semiconductor laser device portion in a direction perpendicular to the cavity surface, wherein the first end is placed inwardly of the second end and the third end in the direction perpendicular to the cavity surface.

* * * * *